United States Patent
Park et al.

(10) Patent No.: US 9,013,674 B2
(45) Date of Patent: Apr. 21, 2015

(54) EXPOSURE APPARATUS INCLUDING THE EXPOSURE HEAD AND CONTROL METHOD THEREOF

(75) Inventors: Sang Hyun Park, Yongin-si (KR); Sang Don Jang, Suwon-si (KR); Hi Kuk Lee, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 911 days.

(21) Appl. No.: 13/185,983

(22) Filed: Jul. 19, 2011

(65) Prior Publication Data

US 2012/0019793 A1 Jan. 26, 2012

(30) Foreign Application Priority Data

Jul. 26, 2010 (KR) ........................ 10-2010-0071953

(51) Int. Cl.
*G03F 7/20* (2006.01)

(52) U.S. Cl.
CPC ........ *G03F 7/70291* (2013.01); *G03F 7/70275* (2013.01)

(58) Field of Classification Search
CPC ............ G03F 7/70275; G03F 7/70291; G03F 7/70141; G03F 7/70208; G03F 7/7085
USPC ........... 355/46, 52, 53, 55, 67–71, 72, 75, 77; 250/492.1, 492.2, 492.22, 493.1, 548; 430/5, 8, 30, 311, 312, 321, 322
See application file for complete search history.

(56) References Cited

U.S. PATENT DOCUMENTS

| | | | | |
|---|---|---|---|---|
| 5,617,211 A | * | 4/1997 | Nara et al. | 356/401 |
| 5,883,697 A | * | 3/1999 | Ohyama | 355/18 |
| 5,912,726 A | * | 6/1999 | Toguchi et al. | 355/53 |
| 7,864,293 B2 | | 1/2011 | Kato et al. | |
| 2004/0252180 A1 | * | 12/2004 | Takada | 347/239 |
| 2005/0213071 A1 | * | 9/2005 | Fukuda | 355/69 |
| 2005/0271421 A1 | * | 12/2005 | Uemura et al. | 399/191 |
| 2007/0029507 A1 | | 2/2007 | Steenbrink et al. | |
| 2007/0296936 A1 | | 12/2007 | Kato et al. | |
| 2008/0052925 A1 | * | 3/2008 | Hirashima | 33/18.1 |
| 2010/0123745 A1 | * | 5/2010 | Nakaya et al. | 347/9 |

FOREIGN PATENT DOCUMENTS

| | | |
|---|---|---|
| EP | 1843204 A1 | 10/2007 |
| JP | 2005316461 A | 11/2005 |
| KR | 102007009526 | 9/2007 |
| KR | 10-2010-042864 | 4/2010 |
| WO | WO-2006080285 A1 | 8/2006 |

* cited by examiner

*Primary Examiner* — Christina Riddle

(74) *Attorney, Agent, or Firm* — Harness, Dickey & Pierce, P.L.C.

(57) ABSTRACT

According to example embodiments, a method of operating an exposure apparatus including a stage having a plurality of beam measurement devices, and an exposure head unit having a first set of exposure heads and a second set of exposure heads includes measuring a position of a first exposure head of the first set of exposure heads by moving the stage to coincide a first beam measurement device of the plurality of beam measurement devices with the first exposure head, setting the measured position of the first exposure head as a reference position, and measuring positions of the second set of exposure heads with respect to the reference position.

29 Claims, 28 Drawing Sheets

EXPOSURE APPARATUS INCLUDING THE EXPOSURE HEAD AND CONTROL METHOD THEREOF

CROSS-REFERENCE TO RELATED APPLICATION

This application claims priority under 35 U.S.C. §119 to Korean Patent Application No. 10-2010-0071953, filed on Jul. 26, 2010, in the Korean Intellectual Property Office (KIPO), the entire disclosure of which is incorporated herein by reference.

BACKGROUND

1. Field

Example embodiments relate to a maskless exposure apparatus with a plurality of exposure heads.

2. Description of the Related Art

Exposure apparatuses are widely used in a semiconductor or LCD fabrication process. In general, an exposure apparatus exposes a desired pattern on a wafer or a glass substrate using a mask. If the mask is used, problems, such as mask costs and sagging of the substrate due to the large size of the substrate, occur. In order to compensate for these problems, maskless exposure apparatuses using Spatial Light Modulators (SLMs), such as Digital Micromirror Devices (DMDs), are a focus of attention. A maskless exposure apparatus forms a virtual mask through angle adjustment of micromirrors corresponding to a desired pattern by irradiating beams onto SLMs.

In order to achieve exposure of a substrate, the substrate is scanned using a plurality of exposure heads provided with the SLMs mounted thereon. The most important factor in exposure of the substrate is to achieve precise exposure of a desired level at a desired position. If actual positions of the plural exposure heads are different from expected positions, exposure is not achieved at a precise position, and thus exposure quality is greatly lowered.

SUMMARY

According to example embodiments, a method of operating an exposure apparatus, including a stage having a plurality of beam measurement devices, and including an exposure head unit having a first set of exposure heads and a second set of exposure heads, includes measuring a position of a first exposure head of the first set of exposure heads by moving the stage to coincide a first beam measurement device of the plurality of beam measurement devices with the first exposure head, setting the measured position of the first exposure head as a reference position, and measuring positions of the second set of exposure heads with respect to the reference position.

According to example embodiments, measuring the positions of the second set of exposure head includes, moving the stage to coincide a second beam measurement device of the plurality of beam measurement devices with the first exposure head, measuring a position of the second beam measurement device with respect to the reference position, moving the stage to coincide the second beam measurement device with a first exposure head of the second set of exposure heads, and measuring a position of the first exposure head of the second set of exposure heads with respect to the reference position.

According to example embodiments, the stage moves in at least two mutually orthogonal directions.

According to example embodiments, at least one of the mutually orthogonal directions is a scanning direction of the exposure apparatus.

According to example embodiments, the method further includes obtaining and storing positions of the exposure heads of the first and second set of exposure heads with respect to the reference position.

According to example embodiments, the method further includes correcting an error between desired positions of the first and second set of exposure heads and positions of the first and second set of exposure heads obtained during exposure based on the measured positions of the first and second set of exposure heads.

According to example embodiments, correcting an error includes correcting an error associated with a rotation of the first and second set of exposure heads.

According to example embodiments, the coinciding includes coinciding a field of view of the first beam measurement device with a desired beam spot of the first exposure head.

According to example embodiments, the method further includes moving the stage to coincide a second exposure head of the first set of exposure heads with the first beam measurement device, calculating a distance moved by the stage as a distance between the first and second exposure heads, sequentially repeating the moving and calculating with respect to the remaining exposure heads of the first set of exposure heads, and mapping the distances the stage moves with reference to the first exposure head.

According to example embodiments, the method further includes moving the stage to coincide the second beam measurement device with a second exposure head of the second set of exposure heads, measuring a position of the second exposure head of the second set of exposure heads with respect to the reference position, sequentially repeating the moving and measuring with respect to the remaining exposure heads of the second set of exposure heads, and mapping the distances the stage moves with respect to the reference position.

According to example embodiments, the method further includes providing a plurality of scopes in the first and second set of exposure heads, each of the plurality of scopes being between the exposure heads of the first set of exposure head and between exposure heads of the second set of exposure heads, and measuring positions of the plurality of scopes.

According to example embodiments, the measuring the positions of the plurality of scopes includes measuring a position of a first scope of the plurality of scopes by moving the stage to coincide a first mark provided on at least one of the plurality of beam measurement devices with the first scope, moving the stage to coincide a second scope of the plurality of scopes with the first mark, calculating a distance moved by the stage as a distance between the first and second scopes, and mapping the distance as a position coordinate of the second scope with reference to the first scope.

According to example embodiments, the method further includes detecting distortion of a substrate on the stage using the plurality of scopes.

According to example embodiments, the distortion of the substrate includes one of size errors, position errors, rotation errors, and warpage errors of the substrate.

According to example embodiments, the method operates operating a maskless exposure apparatus.

According to example embodiments, a computer program product includes a non-transitory computer useable recording medium having computer readable program codes embodied in the medium that, when executed on a computer, cause the computer to carry out the method.

According to example embodiments, an exposure apparatus includes a stage including a plurality of beam measurement devices, the stage configured to move a substrate to expose a desired pattern on the substrate, an exposure head unit including a plurality of exposure heads, the plurality of exposure heads configured to expose the desired pattern on the substrate, and a control unit configured to sequentially coincide at least one of the plurality of beam measurements devices with the plurality of exposure heads and measuring a position of each exposure head during each coincidence.

According to example embodiments, a position of one of the exposure heads is set as a reference position and the positions of the remaining exposure heads are mapped with respect to the reference position.

According to example embodiments, the control device is further configured to coincide a position of a second beam measurement device of the plurality of beam measurement devices with a first exposure head, measure a position of the second beam measurement device with respect to the reference position, coincide the position of the second beam measurement device with a position of a second exposure head of the plurality of exposure heads, and measure a position of the second exposure head with respect to the reference position.

According to example embodiments, the stage moves in at least two mutually perpendicular directions.

According to example embodiments, at least one of the at least two directions is a scanning direction of the exposure apparatus.

According to example embodiments, the control unit is further configured to store position coordinates of each the measured exposure heads with respect to the reference position.

According to example embodiments, the control unit is further configured to correct an error between desired positions of the exposure heads and positions of the exposure heads obtained during exposure based on the measured positions of the exposure heads.

According to example embodiments, the error includes an error associated with a rotation of the plurality of exposure heads.

According to example embodiments, the control unit is configured to coincide a field of view of the at least one first beam measurement device with a desired beam spot of an exposure head.

According to example embodiments, the exposure apparatus further includes a plurality of scopes, at least one of the plurality of scopes being between the plurality of exposure heads, wherein the control unit measures positions of the plurality of scopes based on the reference position.

According to example embodiments, the exposure apparatus further includes a plurality of marks on the plurality of beam measurement devices, wherein the control unit is configured to, measure a position of a first scope of the plurality of scopes by moving the stage to coincide a first mark of the plurality of marks with the first scope, move the stage to coincide a second scope of the plurality of scopes with the first mark, calculate a distance moved by the stage as a distance between the first and second scopes, and map the distance as a position coordinate of the second scope with reference to the first scope.

According to example embodiments, the control unit is further configured to detect distortion of a substrate on the stage via the plurality of scopes.

According to example embodiments, the distortion of the substrate includes one of size errors, position errors, rotation errors, and warpage errors of the substrate.

According to example embodiments, the exposure apparatus is a maskless exposure apparatus.

BRIEF DESCRIPTION OF THE DRAWINGS

The above and other features and advantages will become more apparent by describing in detail example embodiments with reference to the attached drawings. The accompanying drawings are intended to depict example embodiments and should not be interpreted to limit the intended scope of the claims. The accompanying drawings are not to be considered as drawn to scale unless explicitly noted.

DETAILED DESCRIPTION

Figure 1:
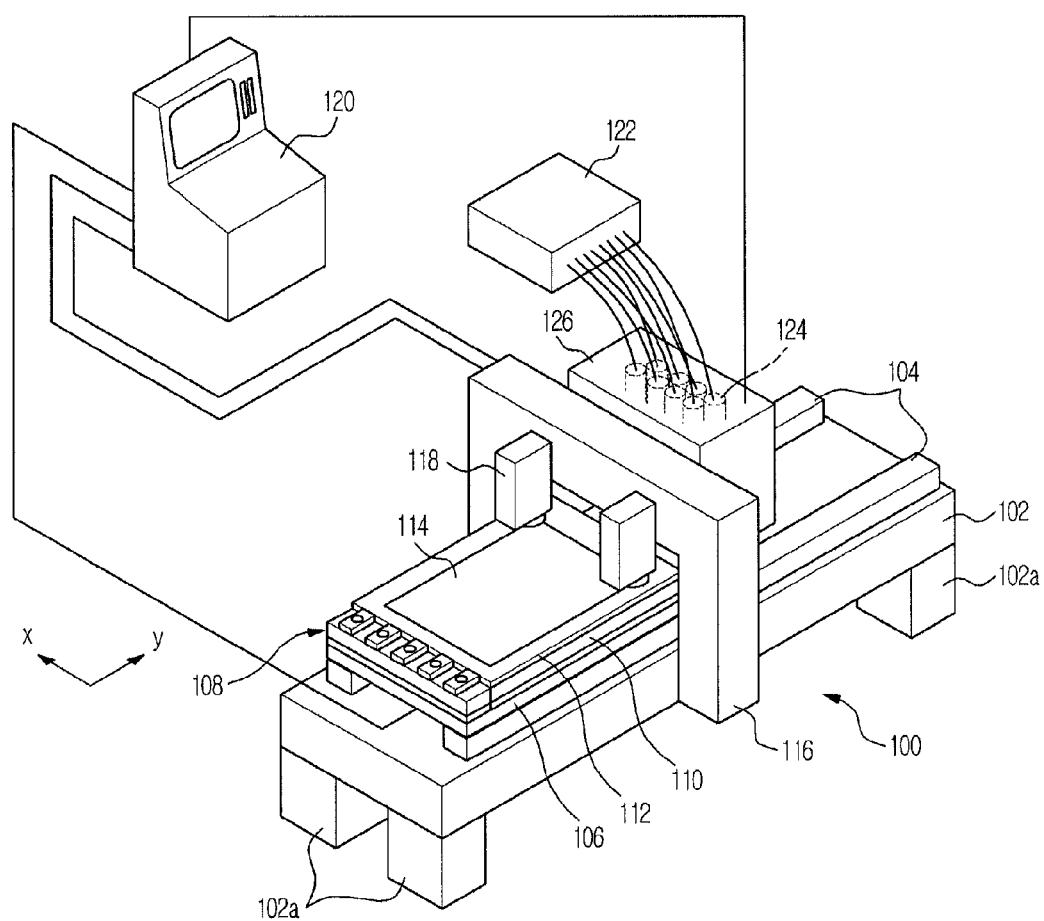
FIG. 1 is a view illustrating a maskless exposure apparatus, according to example embodiments.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

FIG. 1 is a view illustrating a maskless exposure apparatus according to example embodiments. As shown in FIG. 1, a maskless exposure apparatus 100 is formed in a flat bed type, and includes a table 102 supported by four leg members 102a, and a stage 106 movable in the x direction and the y direction on guides 104 located on the table 102. A plurality of beam measurement devices 108 are fixed to one side of the stage 106. A chuck 110 and a substrate 112 are sequentially located on the stage 106, and a photosensitive material 114, such as photoresist, is applied to the upper surface of the substrate 112. A gate-shaped frame 116 is connected to the central portion of the table 102, and two position sensors 118 are installed on a side (for example, left side) of the gate-shaped frame 116. However, the location and number of the position sensors 108 is not limited thereto and can be varied as per requirements. The position sensors 118 sense movement of the stage 106 when the stage 106 moves, and transmits a sensing signal to a control unit 120, which will be described later. When the stage 106 moves in the positive or negative x directions and the positive and negative y directions, the beam measurement devices 108 and the substrate 112 also move in the positive and negative x directions and the positive and negative y directions A light source unit 122 to generate light beams, such as laser beams, and an exposure head unit 126 including a plurality of exposure heads 124 are installed on a side of the gate-shaped frame 116 opposite to the two position sensors 118. However, the location of the exposure head unit 126 is not limited thereto. The exposure head unit 126 receives multiple beams generated by the light source unit 122 and then irradiates the multiple beams onto the photosensitive material 114 on the substrate 112 through the exposure heads 124, thereby forming of a desired pattern on the substrate 112.

The control unit 120 controls the irradiation of the multiple beams through spatial light modulators (not shown) based on exposure data of the desired pattern, and performs calibration and measurement of positions of the beam measurement devices 108 and the exposure heads 124.

Figure 2:
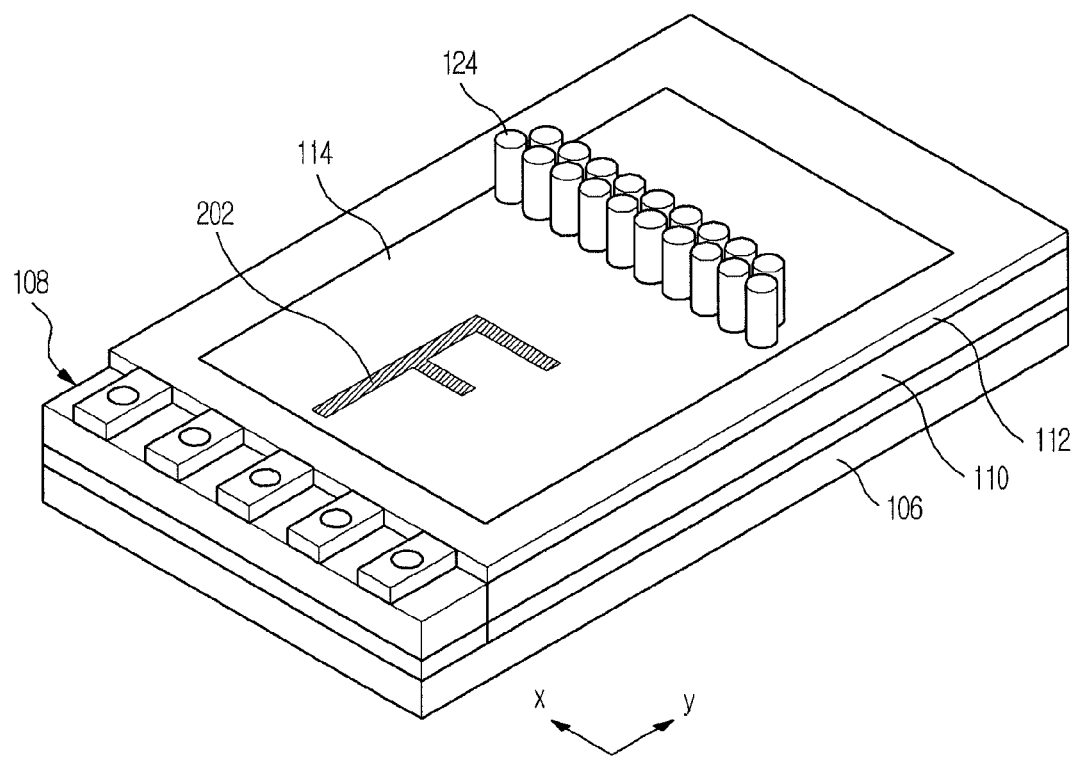
FIG. 2 is a view illustrating a stage and a plurality of exposure heads of the maskless exposure apparatus, according to example embodiments.

FIG. 2 is a view illustrating the stage and the plural exposure heads of the maskless exposure apparatus according to example embodiments. As shown in FIG. 2, as the stage 106 moves in the negative y direction, the substrate 112 passes underneath the plural exposure heads 124. When, during such a process, the multiple beams are irradiated onto the photosensitive material 114 of the substrate 112 through the plural exposure heads 124, a desired pattern is formed on the surface of the substrate 112. In FIG. 2, an F-shaped pattern 202 is formed.

Figure 3:
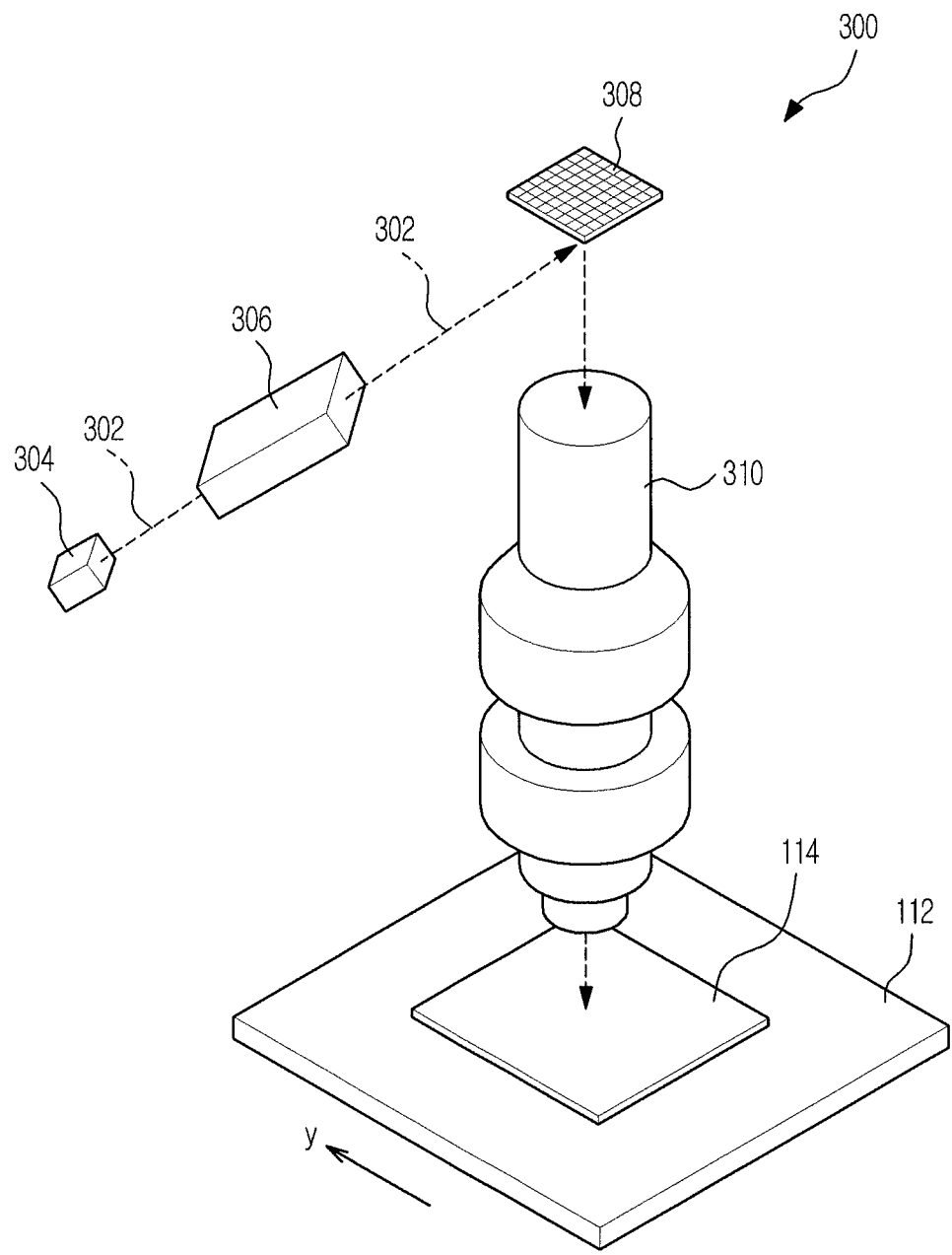
FIG. 3 is a view illustrating a configuration of one exposure head of the maskless exposure apparatus, according to example embodiments.

FIG. 3 is a view illustrating a configuration of one exposure head of the maskless exposure apparatus according to example embodiments. As shown in FIG. 3, one exposure head 300 includes an illumination optical system 306 to correct or adjust an exposure beam 302 emitted from a light source 304 so as to provide uniform illumination and then to emit the corrected exposure beam 302, a light modulation element 308 to modulate the exposure beam 302 emitted from the illumination optical system 306 according to pattern data (image data), and an exposure optical system 310 to transmit the exposure beam 302, modulated by the light modulation element 308, to the substrate 112 as a beam spot array. The light source 304 may be included in the light source 122 (FIG. 1) and the exposure beam 302 emitted by the light source 304 may be transported to the illumination optical system 306 using, for example, fiber optic cables or the like.

The light source 304 emits the exposure beam 302, and includes a semiconductor laser or an ultraviolet lamp. The light modulation element 308 includes a Spatial Light Modulator (SLM). As the light modulation element 308, a Micro Electro Mechanical System (MEMS) type Digital Micromirror Device (DMD), a two-dimensional Grating Light Valve (GLV), an electric optical element using lead zirconate titanate (PLZT) which is a light-transmitting ceramic, and a Ferroelectric Liquid Crystal (FLC) are used. Among these, a Digital Micromirror Device (DMD) may be used as the light modulation element 308. Hereinafter, for convenience of description, the light modulation element 308 including the DMD will be described.

Figure 4:
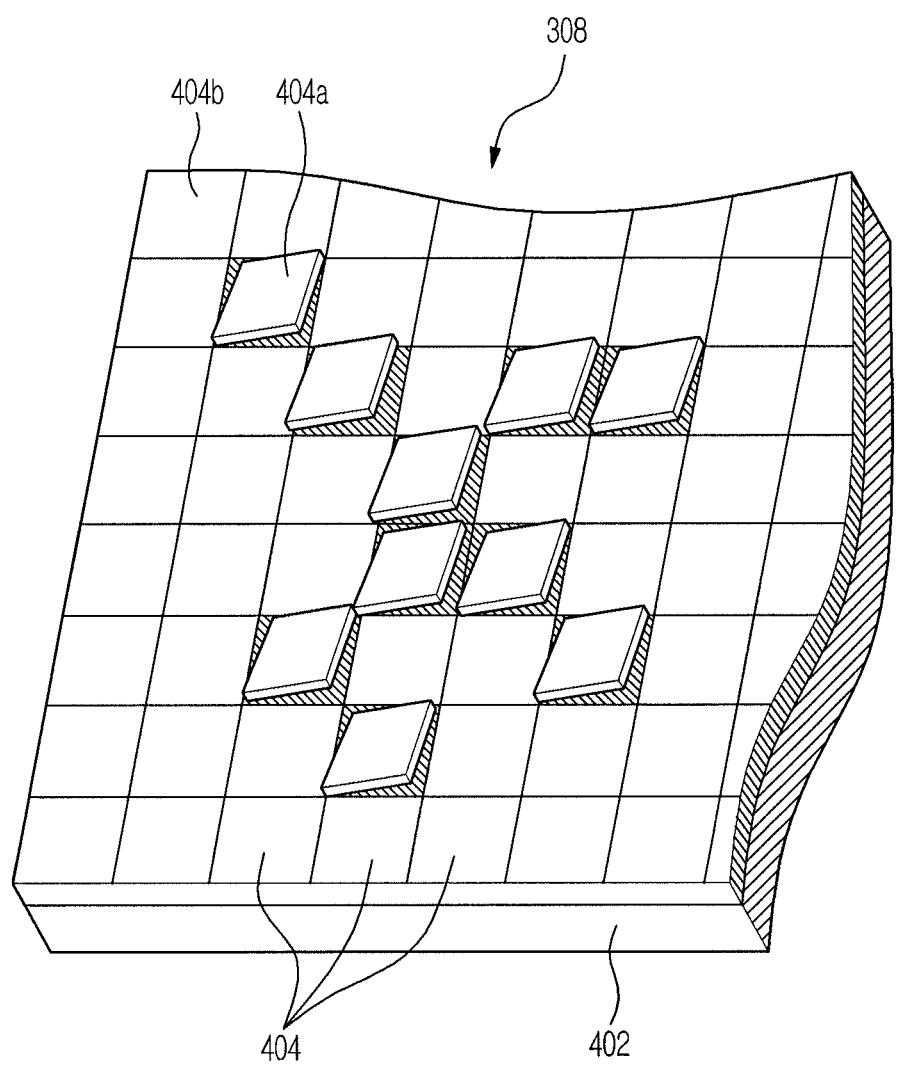
FIG. 4 is a view illustrating a configuration of a Digital Micromirror Device (DMD) of the maskless exposure apparatus according to example embodiments.

FIG. 4 is a view illustrating a configuration of the Digital Micromirror Device (DMD) of the maskless exposure apparatus according to example embodiments. As shown in FIG. 4, the DMD includes a memory cell 402 (for example, an SRAM cell), and a plurality of micromirrors 404 arranged in a matrix on the memory cell 402. Angles of the respective micromirrors 404 are varied based on control signals generated according to image data, thereby reflecting necessary beams at a designated angle so as to be transmitted to the exposure optical system 310 and reflecting other beams at a different angle so as not to be transmitted to the exposure optical system 310. When a digital signal is recorded in the memory cell 402, the micromirrors 404 are tilted at a designated angle (for example, 12°). On/off control of the respective micromirrors 404 is achieved by a head control unit 708, which will be described later. In FIG. 4, micromirrors 404*a* are in an on state, and micromirrors 404*b* are in an off state. The beams reflected by the micromirrors 404*a* in the on state are modulated into an exposure state, and then are irradiated onto the substrate 112 to expose the photosensitive material, and the beams reflected by the micromirrors 404*b* in the off state are modulated into a non-exposure state, and then are not transmitted to the substrate 112. Thereby, a pattern is formed.

Figure 5:
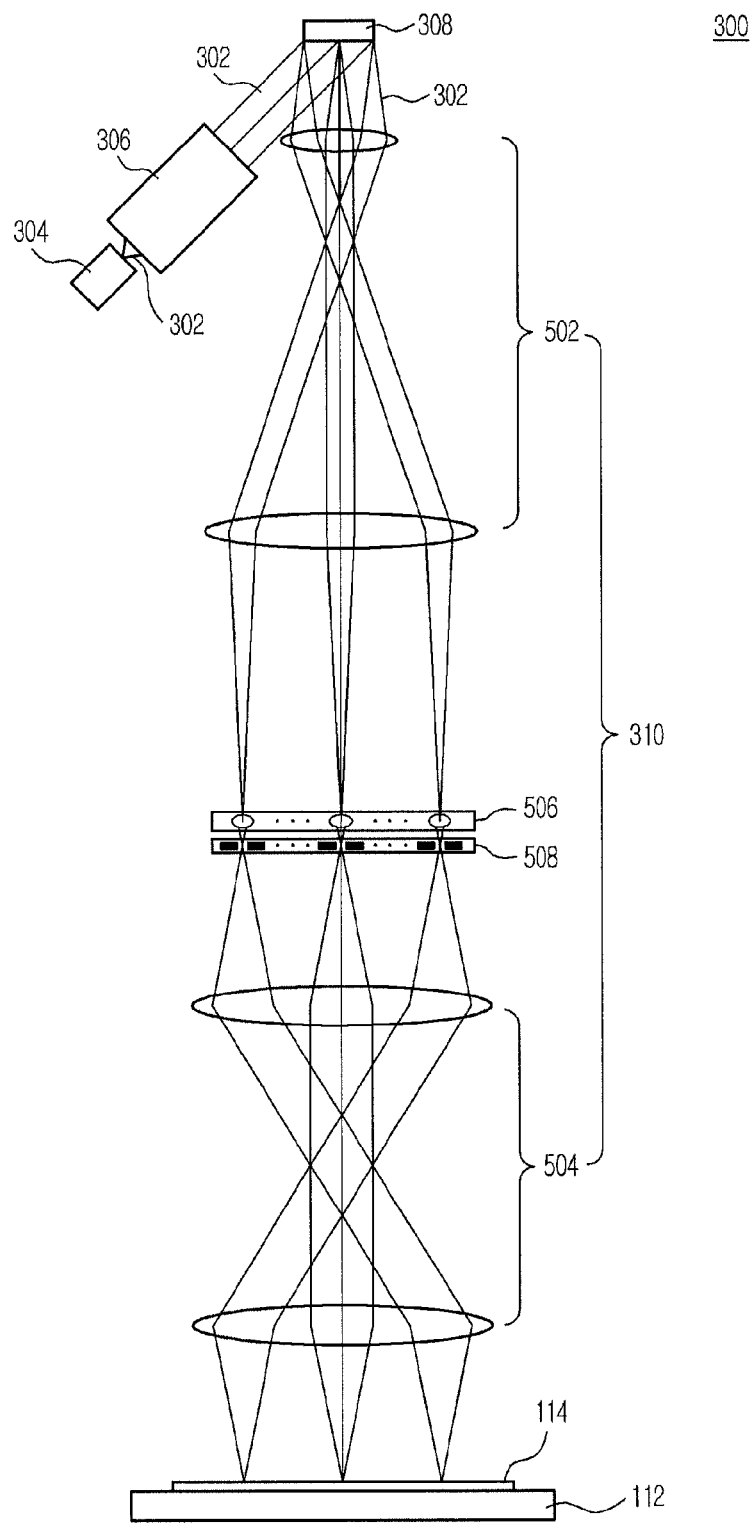
FIG. 5 is a view illustrating a detailed structure of the exposure head of FIG. 2, according to example embodiments.

FIG. 5 is a view illustrating a detailed structure of the exposure head of FIG. 2. With reference to FIG. 5, the exposure optical system 310 includes a first imaging optical system 502 and a second imaging optical system 504, a microlens array 506, and an aperture array 508 along a route through which the exposure beam 302 passes.

The first imaging optical system 502 is a double telecentric optical system. The first imaging optical system 502 magnifies an image having passed through the optical modulation element 308 (for example, about 4×), and then forms the magnified image on an aperture plane of the microlens array 506.

The second imaging optical system 504 is also a double telecentric optical system. The second imaging optical system 504 forms a plurality of beam spots, formed on a focal plane of the microlens array 506, on the substrate 112 with a predetermined/desired magnification (for example, about 1×). Although this example embodiment discloses magnifications of the first imaging optical system 502 and the second imaging optical system 504 as being 4× and 1×, respectively, example embodiments are not limited thereto, of an optimum combination of the magnifications may be deduced according to a desired size of the beam spots, the minimum feature size of a pattern to be exposed, and/or the number of the exposure heads 124 used in the maskless exposure device 100.

The microlens array 506 is formed by two-dimensionally arranging a plurality of microlenses corresponding to the micromirrors 404 of the light modulation element 308. For example, if the light modulation element 308 includes 1920× 400 micromirrors 404, 1920×400 microlenses are correspondingly arranged. Further, an arrangement pitch of the microlenses may be substantially equal to a value obtained by multiplying an arrangement pitch of the micromirrors 404 of the light modulation element 308 by the magnification of the first imaging optical system 502.

The aperture array 508 is formed by two-dimensionally arranging a plurality of pin holes corresponding to the microlenses on the focal plane of the microlens array 506. The pin holes standardize the beam spots focused by the microlenses to a designated/desired size, or to block noise generated by the exposure optical system 310. For example, the pin holes have a diameter of about 6 μm.

Figure 6:
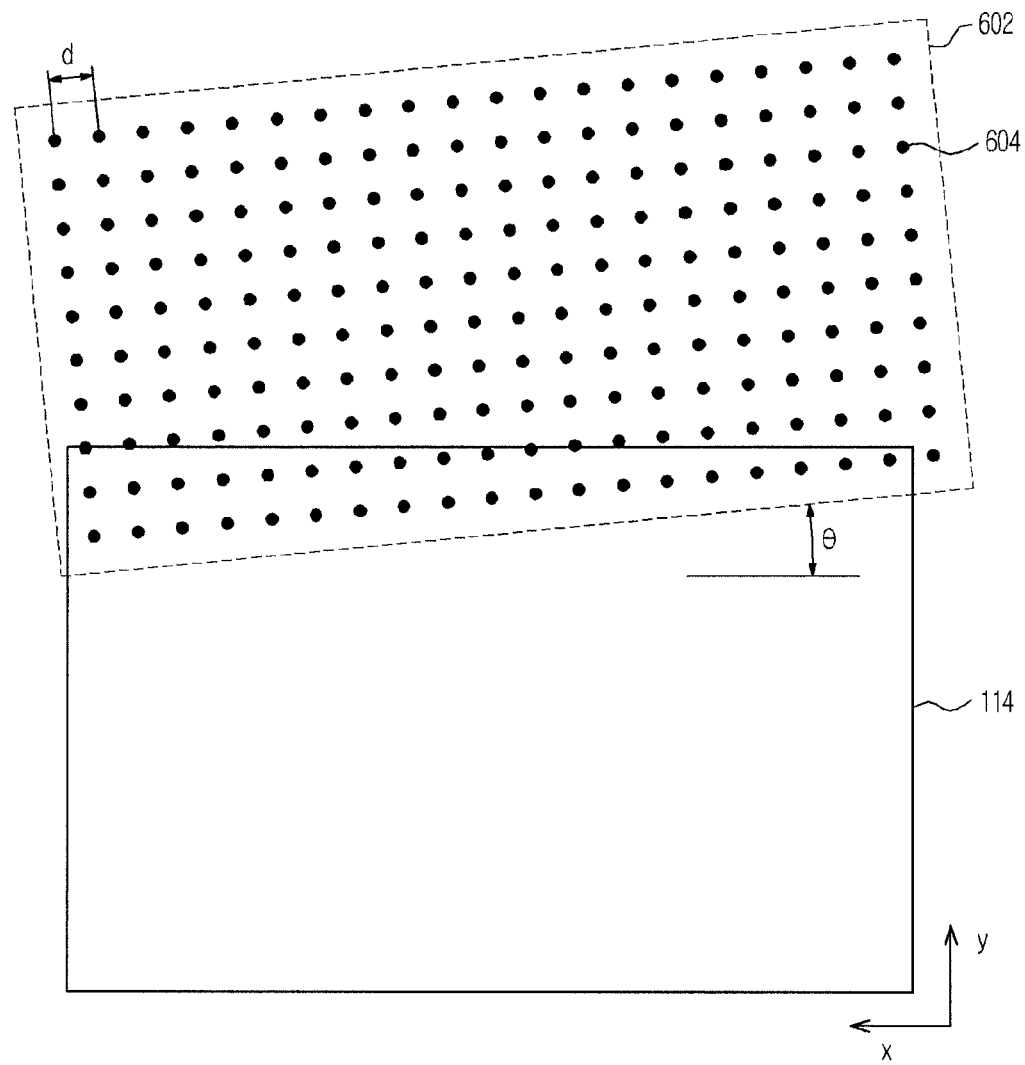
FIG. 6 is a view illustrating a beam spot array of the maskless exposure apparatus, according to example embodiments.

FIG. 6 is a view illustrating a beam spot array of the maskless exposure apparatus according to example embodiments.

As shown in FIG. 6, the exposure beam 302 focused on the focal plane of the microlens array 506 from the light modulation element 308 via the first imaging optical system 502 has a circular or oval shape. Thereafter, the exposure beam 302 is focused on the substrate 112 via the second imaging optical system 504, thereby forming a beam spot array 602. The beam spot array 602 includes a plurality of beam spots 604 arranged in a matrix. For example, an arrangement pitch of the beam spots 604 is about 55 μm, and the beam spots 604 having a circular shape are arranged in a Gaussian distribution, a Full Width at Half Maximum (FWHM) of which is about 2.5 μm. An arrangement direction of the beam spot array 602 is tilted at a designated/desired arrangement angle θ with respect to a scanning direction (for example, a y direction). It functions to increase resolution of the maskless exposure apparatus 100.

Figure 7:
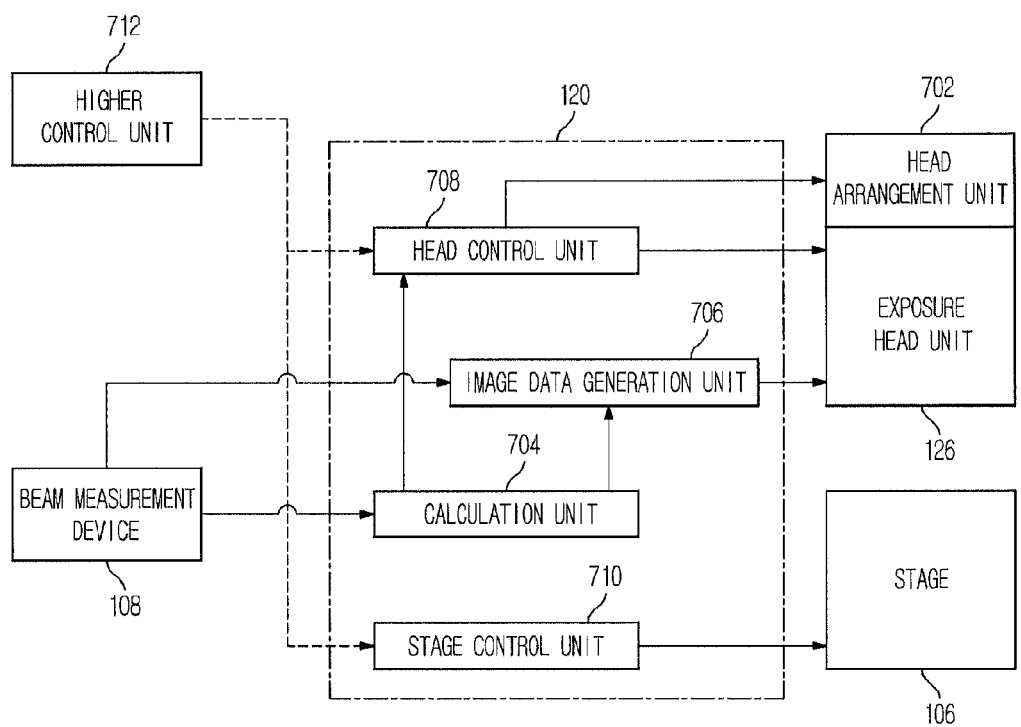
FIG. 7 is a view illustrating a control system of the maskless exposure apparatus, according to example embodiments.

FIG. 7 is a view illustrating a control system of the maskless exposure apparatus according to example embodiments. In FIG. 7, a head arrangement unit 702 performs 6 degree of freedom arrangement of the exposure heads 124. The exposure heads 124 may be arranged (for example, automatically) by the head arrangement unit 702, or may be manually arranged by an operator. Further, interval arrangement of the exposure heads 124 may be performed through the head arrangement unit 702, and may be performed by shutting off some lines of micromirrors 404 at both ends of the light modulation element 308. The head arrangement unit 702 may be included in the exposure head unit 126 or, alternatively, may be a part of the control unit 120. Further, the beam measurement devices 108 measure positions of the plural beam spots 604 of the beam spot array 602 arranged in the matrix formed from the exposure beam 302 on the substrate 112, and measure beam power and beam size of the beam spots 604 as needed. Further, a higher control unit 712 is a main controller to control the general operation of the maskless exposure apparatus 100, and provides a command to perform exposure to a head control unit 708 and a stage control unit 710. The higher control unit 712 may be included together with the control unit 120 or may be located separate from the control unit 120, for example, remotely.

A calculation unit 704 performs calculation of an exposure dose distribution (Dose X) and a step distance (Xs) using beam position data, beam power data, and beam size data measured by the beam measurement devices 108. Here, the beam data used to perform the calculation may be data obtained by measuring all the beam spots 604 by the beam measurement devices 108, or may be data estimated from data obtained by measuring some samples of the beam spots 604, so in order to reduce measurement time. An image data generation unit 706 serves to generate image data of the light modulation element 308 necessary for exposure based on the beam data measured by the beam measurement devices 108 and the step distance (Xs) calculated by the calculation unit 704. The stage control unit 710 functions to control movement of the stage 106.

Stitching exposure using the maskless exposure apparatus according to example embodiments will be carried out, as follows. First, the substrate 112 is placed on the stage 106 and is then fixed using the chuck 110. In the maskless exposure apparatus 100 in which the beam spot array 602 formed on the substrate 112 from the exposure beam 302 is tilted at a designated/desired angle θ with respect to the scanning direction (y direction), exposure is performed when the stage 106 is driven in the scanning direction.

In the maskless exposure apparatus 100, the size of the light modulation element 308 modulating the exposure beam 302 according to the pattern is small, and thus even though an area of the beam spot array 602 is enlarged through the exposure optical system 310, an exposure width in a subscanning direction (the positive x or negative x direction) covered by one exposure head 124 is generally 60~70 mm. Therefore, if the substrate 112 is large (for example, a width of 2 m or more), when the number of the exposure heads 124 is not sufficient and to cover the whole substrate 112, the exposure heads 124 need to be properly stepped in the sub-scanning direction (for example, x direction) to perform exposure. Therefore, stitching areas where exposure areas overlap are present due to the stepping or are present between the neighboring exposure heads 124 in a case where the number of the exposure heads 124 is sufficient. During the maskless exposure, if an exposure dose received by the stitching areas greatly differs from an exposure dose received by non-stitching areas, this directly influences a pattern line width and Line Edge Roughness (LER), and the stitching areas are in a form of stripes that are visible with the naked eye. These stripes are represented as defects when an LCD panel is fabricated and driven, and thus it is important to perform exposure without generating stitch spots.

Figure 8:
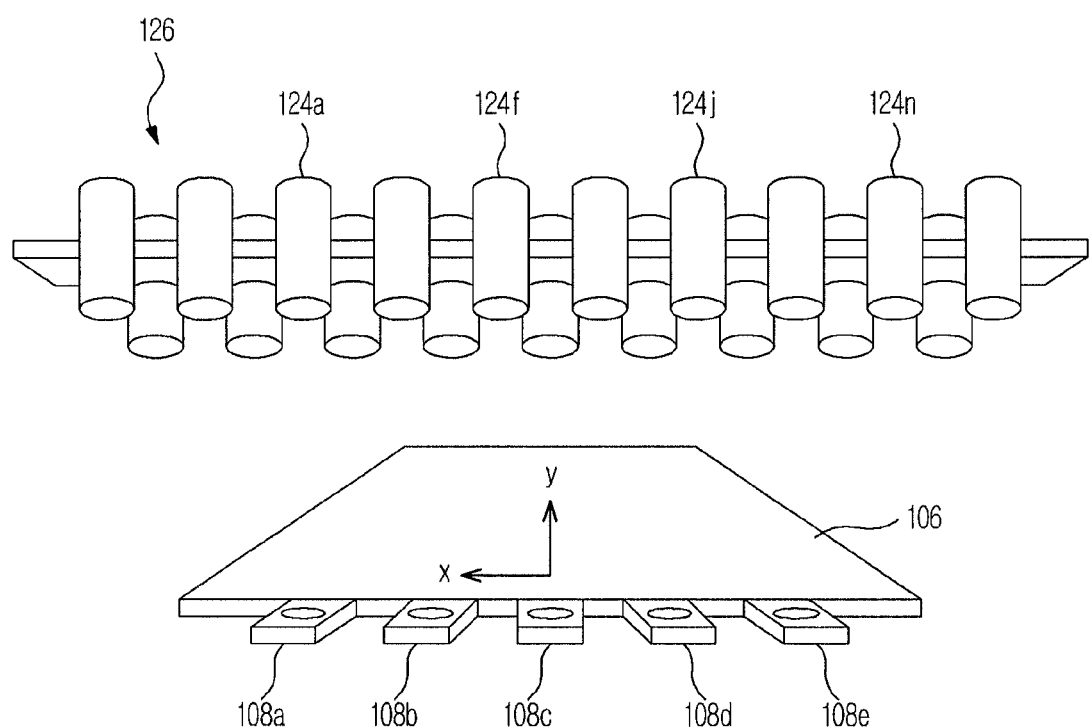
FIG. 8 is a view illustrating an exposure head unit and the stage of the maskless exposure apparatus of FIG. 1, according to example embodiments.

FIG. 8 is a view illustrating the exposure head unit and the stage of the maskless exposure apparatus of FIG. 1. As shown in FIG. 8, the exposure head unit 126 includes nineteen exposure heads 124 (in FIG. 8, only four reference numerals 124a, 124f, 124j, and 124n are provided, however, the number is not limited thereto). The stage 106 is provided below the exposure head unit 126, and five beam measurement devices 108a~108e are fixed to the stage 106. The exposure head unit 126 serves to perform exposure at a desired precise position placed on the stage 106 so as to form a pattern on the substrate. Therefore, the control unit 120 needs to obtain precise relative positions of the plural exposure heads 124 of the exposure head unit 126 and precise relative positions of the plural exposure heads 124 and the stage 106. For this purpose, the control unit 120 measures positions of the respective exposure heads 124 with respect to each other and relative positions of the respective exposure heads 124 with respect to the stage 106, and arranges, for example, maps, the positions of the respective exposure heads 124 and the relative positions of the respective exposure heads 124 with respect to the stage 106 as needed. The respective positions of the exposure heads 124a, 124f, 124j, and 124n of FIG. 8 are used as reference positions or starting positions to measure positions of other exposure heads 124 and positions of the respective beam measurement devices 108a~108e. As will be apparent, the selection of the exposure heads 124a, 124f, 124j, and 124n of FIG. 8 as reference positions or starting positions is a design choice. FIGS. 9A to 13C illustrates methods of measuring positions of exposure heads according to example embodiments.

Figure 9A:
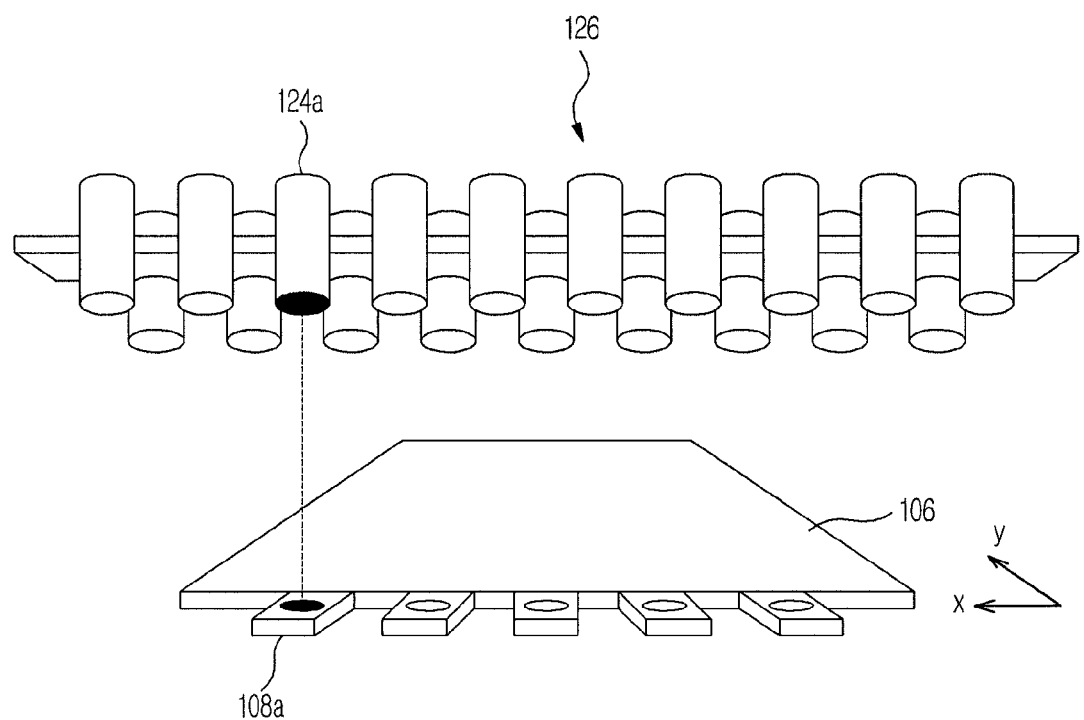
FIGS. 9A to 9F are views illustrating a method of measuring positions of first exposure heads using a first beam measurement device according to example embodiments.

FIGS. 9A to 9F are views illustrating a method of measuring positions of first exposure heads using a first beam measurement device. As shown in FIG. 9A, the stage 106 is moved so that the position of the beam measurement device 108a coincides with the position of the exposure head 124a. Here, the position (coordinates) of the stage 106 serves as a reference position (the origin of a coordinate system). In order to achieve precise position measurement, a predetermined/desired position of a field of view of the beam measurement device 108a coincides with a predetermined/desired beam spot of the beam spot array 602 of FIG. 6. For example, the center of the field of view of the beam measurement device 108a coincides with a beam spot of the beam spot array 602 located at the central position, or a beam spot of the beam spot array 602 located at the rightmost upper end. Such coincidence between a specific beam spot of the beam spot array 602 and a specific position of the field of view of the beam measurement device 108a may be used when positions of other exposure heads are measured using other beam measurement devices.

Figure 9B:
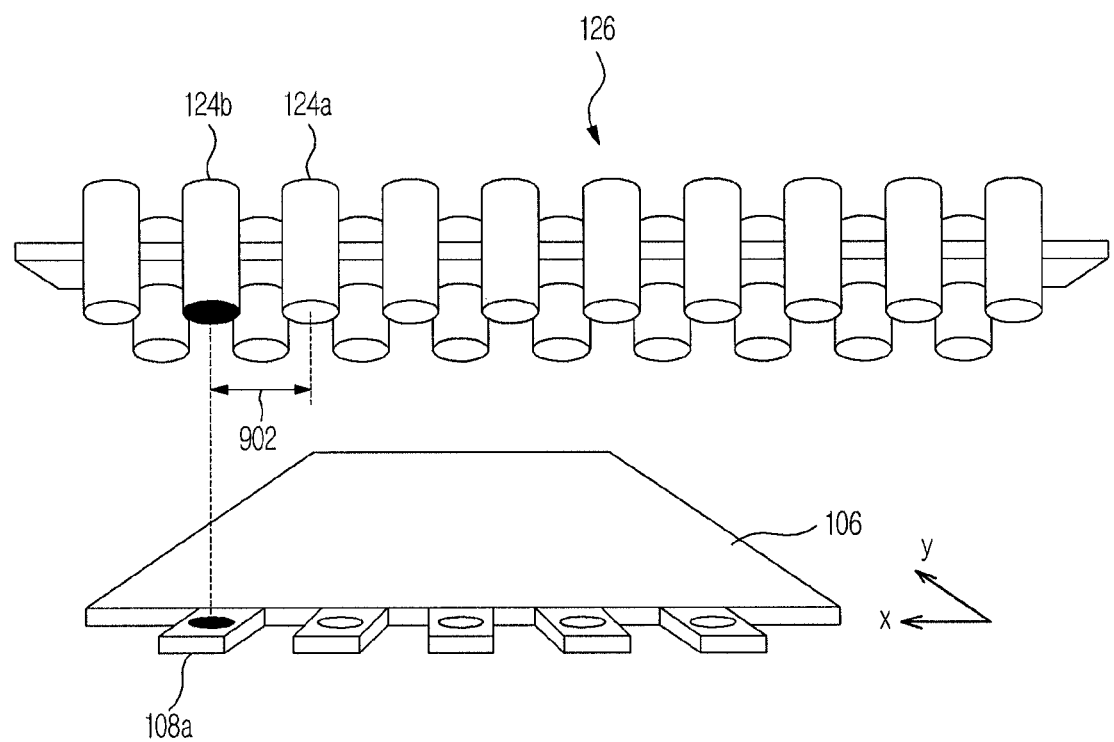

FIG. 9B illustrates a state in which the stage 106 is moved so that the position of the beam measurement device 108a coincides with the position of another exposure head 124b. In the same manner as the coincidence between the exposure head 124a and the beam measurement device 108a, the predetermined/desired position of the field of view of the beam measurement device 108a coincides with a predetermined/desired beam spot of the exposure head 124b. Through the operation of FIG. 9B, a moving distance 902 of the stage 106 that results in the beam measurement device 108a to measure the position of the exposure head 124b is measured. Such a moving distance 902 of the stage 106 is a distance between the exposure head 124a and the exposure head 124b. Although FIG. 9B illustrates that the stage 106 moves only on the x-axis, the stage 106 may move in the positive or negative y direction or positive or negative x direction according to the position of the exposure head 124b.

Figure 9C:
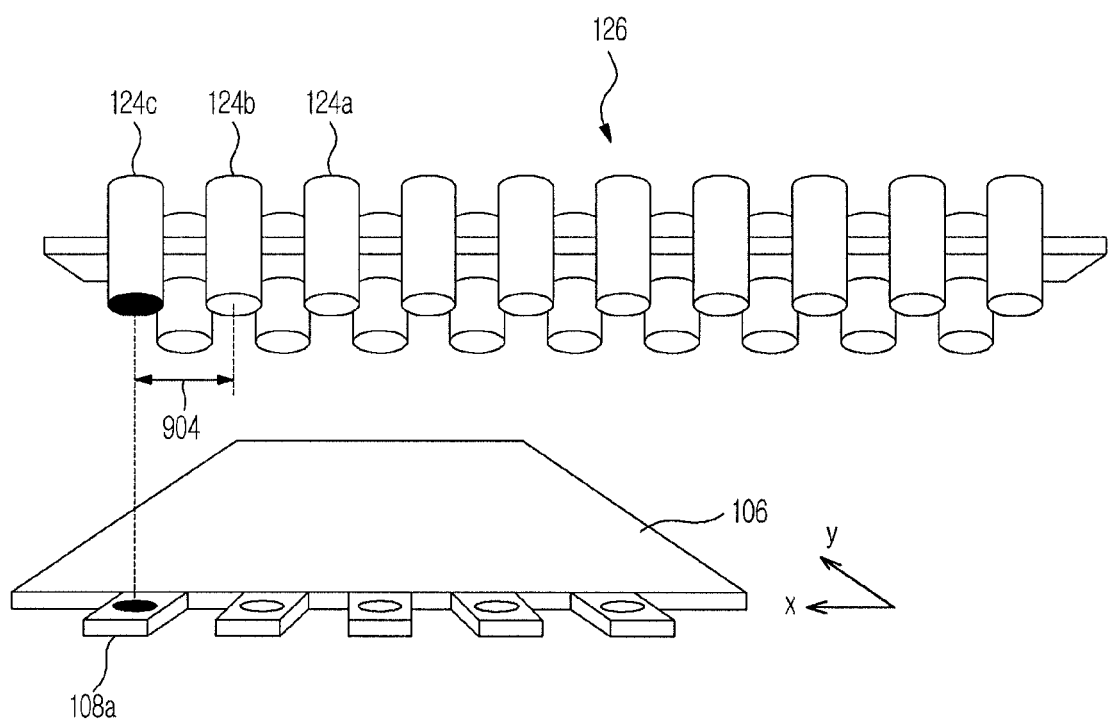

FIG. 9C illustrates a state in which the stage 106 is further moved so that the position of the beam measurement device 108a coincides with the position of another exposure head 124c. At this time, in the same manner as the coincidence between the exposure head 124a and the beam measurement device 108a, the predetermined/desired position of the field of view of the beam measurement device 108a coincides with a predetermined/desired beam spot of the exposure head 124c. Through the operation of FIG. 9C, a moving distance 904 of the stage 106 that results in the beam measurement device 108a to measure the position of the exposure head 124c is measured. Such a moving distance 904 of the stage 106 is a distance between the exposure head 124b and the exposure head 124c. In this case, the stage 106 may also move in the positive or negative y direction or positive or negative x direction according to the position of the exposure head 124c.

Figure 9D:
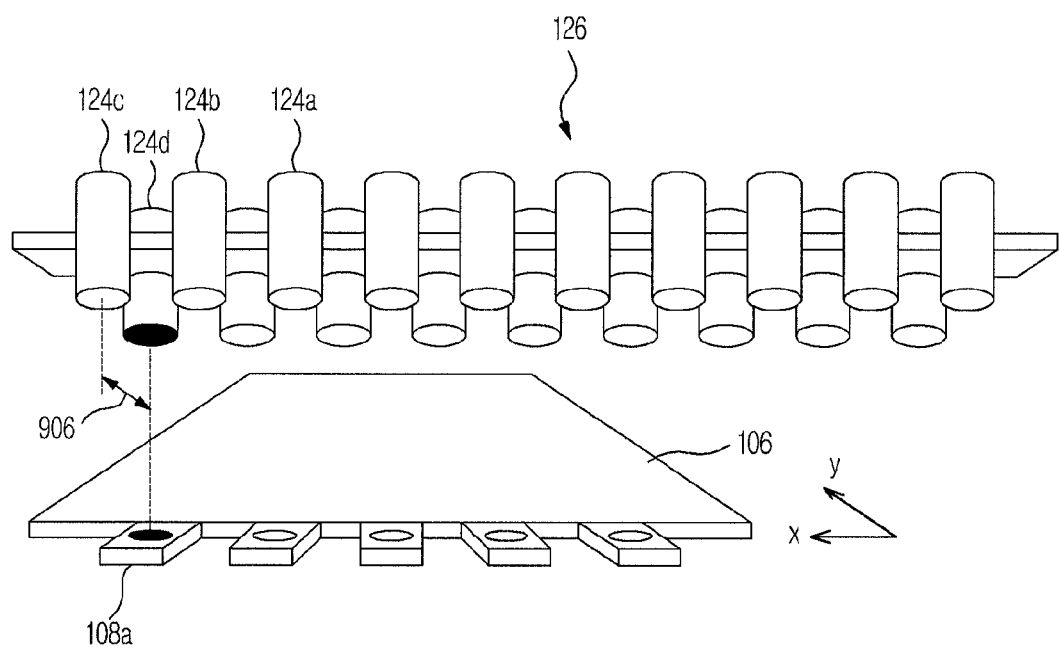

FIG. 9D illustrates a state in which the stage 106 is further moved so that the position of the beam measurement device 108a coincides with the position of another exposure head 124d. At this time, in the same manner as the coincidence between the exposure head 124a and the beam measurement device 108a, the predetermined/desired position of the field of view of the beam measurement device 108a coincides with a predetermined/desired beam spot of the exposure head 124d. Through the operation of FIG. 9D, a moving distance 906 of the stage 106 that results in the beam measurement device 108a to measure the position of the exposure head 124d is measured. Such a moving distance 906 of the stage 106 is a distance between the exposure head 124c and the exposure head 124d. In this case, the stage 106 may also move in the positive or negative y direction or ±x according to the position of the exposure head 124d.

Figure 9E:
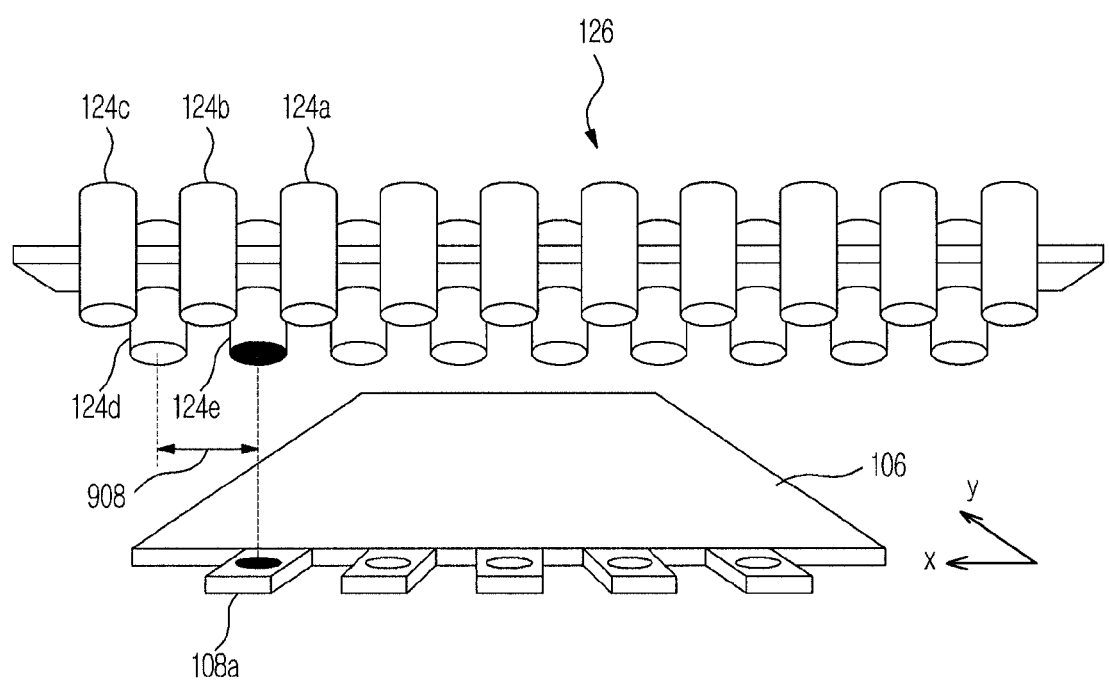

FIG. 9E illustrates a state in which the stage 106 is further moved so that the position of the beam measurement device 108a coincides with the position of another exposure head 124e. At this time, in the same manner as the coincidence between the exposure head 124a and the beam measurement device 108a, the predetermined/desired position of the field of view of the beam measurement device 108a coincides with a predetermined/desired beam spot of the exposure head 124e. Through the operation of FIG. 9E, a moving distance 908 of the stage 106 that results in the beam measurement device 108a to measure the position of the exposure head 124e is measured. Such a moving distance 908 of the stage 106 is a distance between the exposure head 124d and the exposure head 124e. In this case, the stage 106 may also move in the positive or negative y direction or positive or negative x direction according to the position of the exposure head 124e.

Figure 9F:
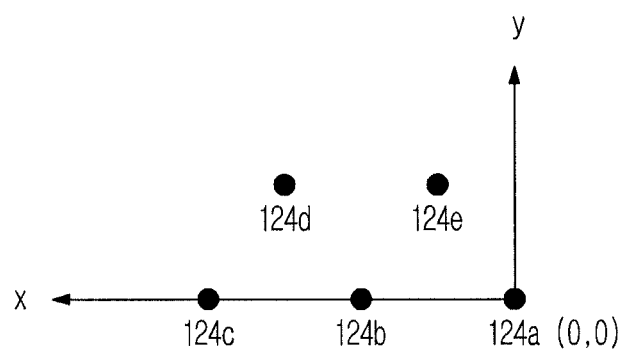

FIG. 9F is a view illustrating respective positions (coordinates) of the five exposure heads 124a~124e measured through the process of FIGS. 9A to 9E. The control unit 120 sets the position of the exposure head 124a to the origin of the coordinate system, calculates the respective coordinates of the exposure heads 124d~124e from the origin (0, 0), and then stores the calculated respective coordinates.

Figure 10A:
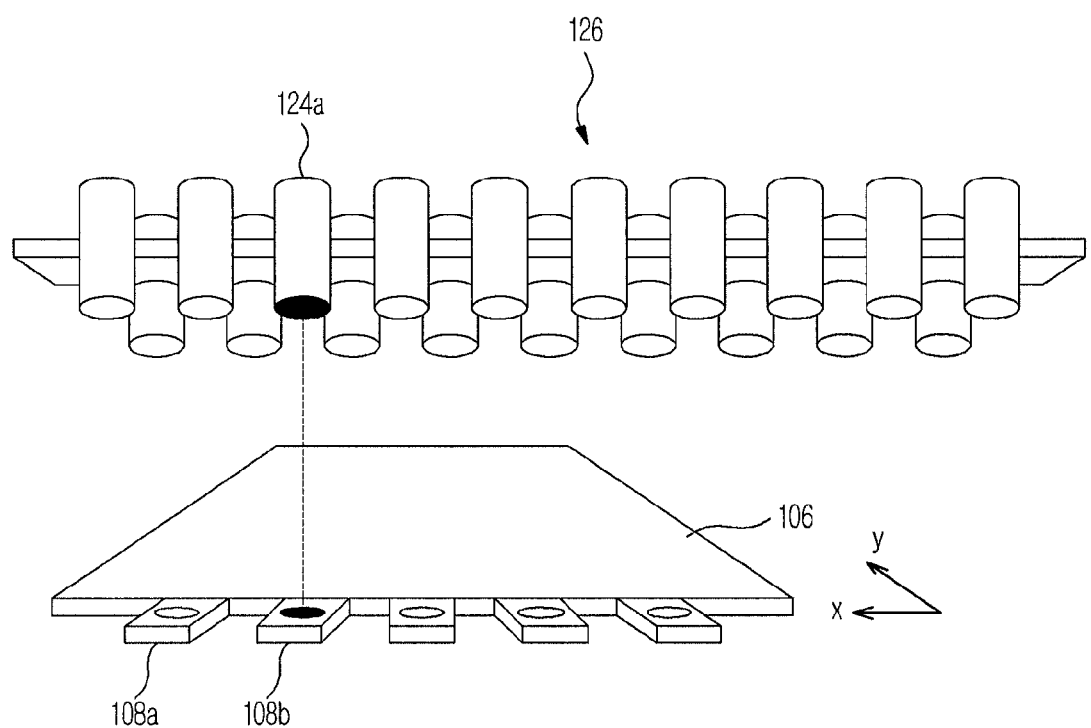
FIGS. 10A to 10C are views illustrating a method of measuring a distance between the first beam measurement device and a second beam measurement device and measuring positions of second exposure heads using the second beam measurement device, according to example embodiments.
Figure 10B:
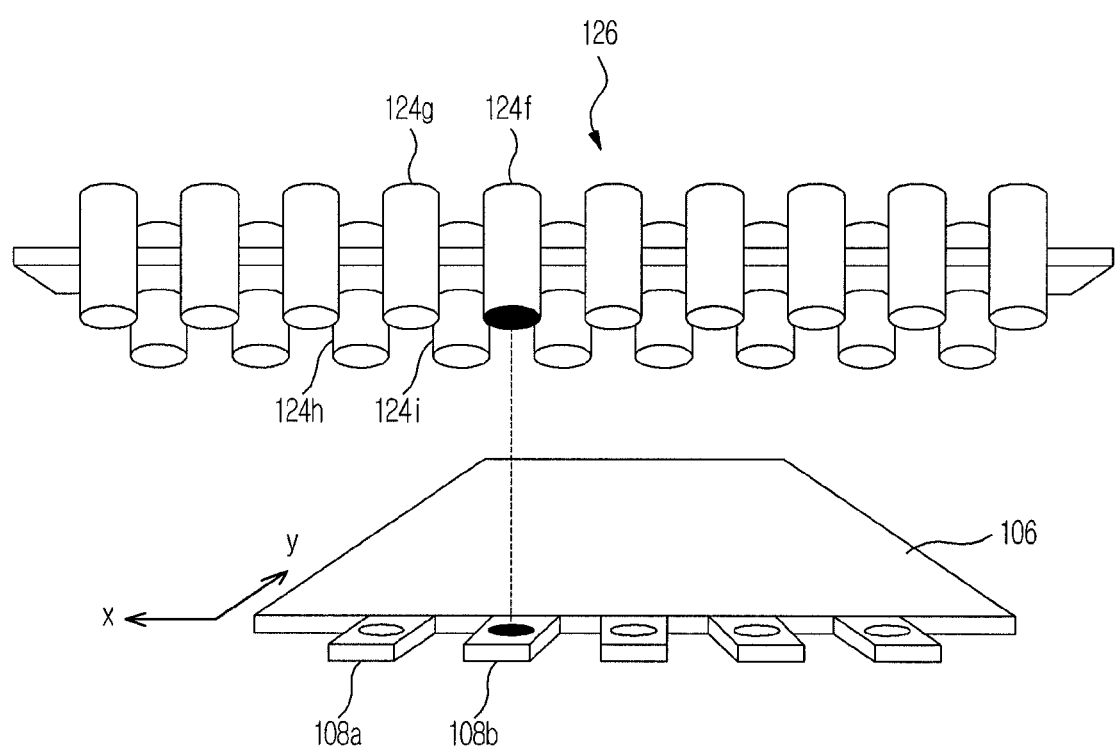
Figure 10C:
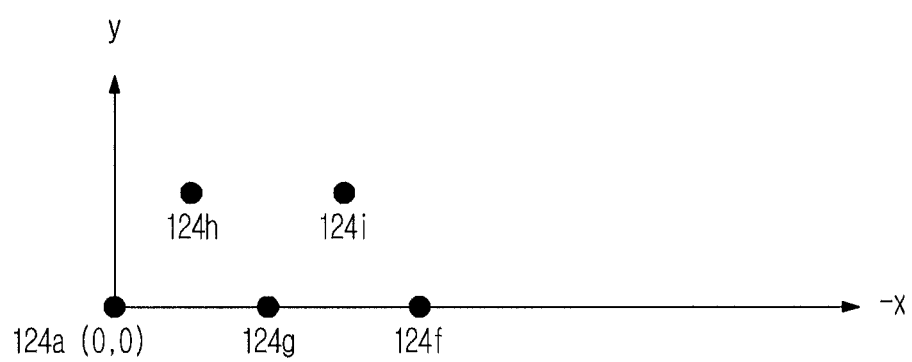

FIGS. 10A to 10C are views illustrating a method of measuring a distance between a first beam measurement device and a second beam measurement device, and measuring positions of second exposure heads using the second beam measurement device. As shown in FIG. 10A, in order to measure the distance between the first beam measurement device (for example, the beam measurement device 108a) and the second beam measurement device (for example, a beam measurement device 108b), the stage 106, initially in a state in which the position of the beam measurement device 108a coincides with the position of the exposure head 124a, is moved so that the position of the beam measurement device 108b coincides with the position of the exposure head 124a. In order to achieve precise position measurement, in the same manner as the coincidence between the exposure head 124a and the beam measurement device 108a (FIGS. 9A-9E), a predetermined/desired position of a field of view of the beam measurement device 108b coincides with a predetermined/desired beam spot of the exposure head 124a. Then the stage 106 is moved so that the position of the beam measurement device 108b coincides with the position of the exposure head 124a and a moving distance of the stage 106 is calculated as a distance between the beam measurement device 108a and the beam measurement device 108b.

FIG. 10B illustrates a state in which the stage 106 is moved so that the position of the beam measurement device 108b coincides with the position of another exposure head 124f. In order to achieve precise position measurement, in the same manner as the coincidence between the exposure head 124a and the beam measurement device 108a (FIGS. 9A-9E, for example), the predetermined/desired position of the field of view of the beam measurement device 108b coincides with a predetermined/desired beam spot of the exposure head 124f. Then the position of the beam measurement device 108b is sequentially coincided with respective positions of exposure heads 124g~124i (for example, similar to the operation described with reference to FIGS. 9B to 9E) in this state, respective distances from the exposure head 124f to the exposure heads 124g~124i are measured through moving distances of the stage 106.

FIG. 10C is a view illustrating respective positions (coordinates) of the four exposure heads 124f~124i measured through the process of FIGS. 10A and 10B. The control unit 120 sets the position of the exposure head 124a to the origin of the coordinate system, calculates the respective coordinates of the four exposure heads 124f~124i from the origin (0, 0), and then stores the calculated respective coordinates.

Figure 11A:
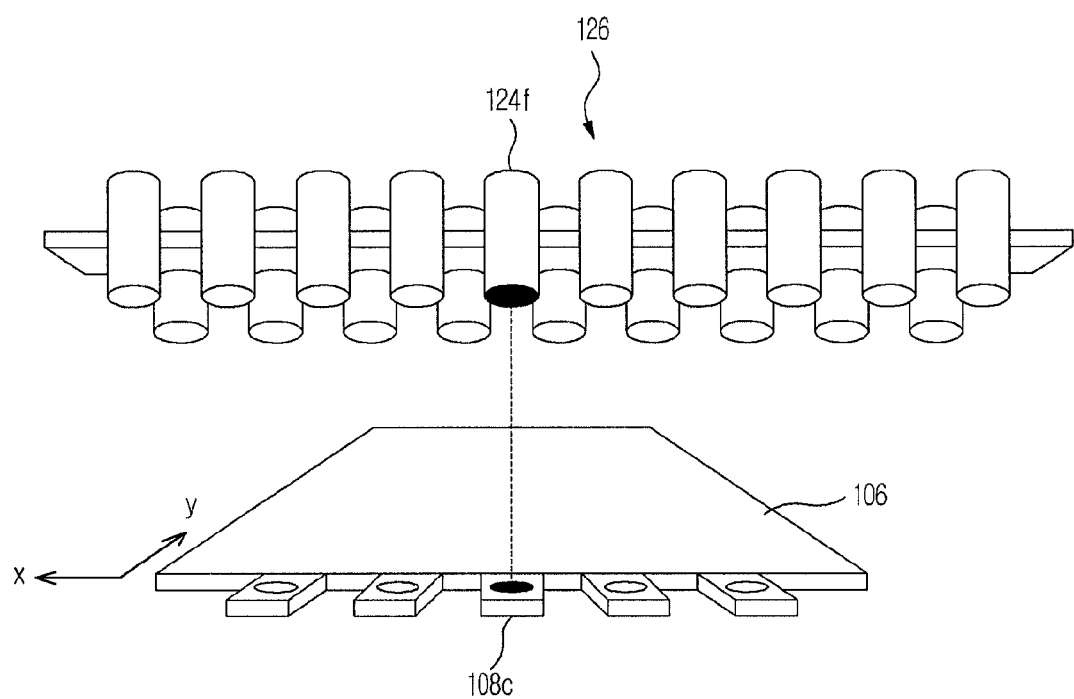
FIGS. 11A to 11C are views illustrating a method of measuring positions of other exposure heads using another beam measurement device, similar to the method of FIGS. 10A to 10C.
Figure 11B:
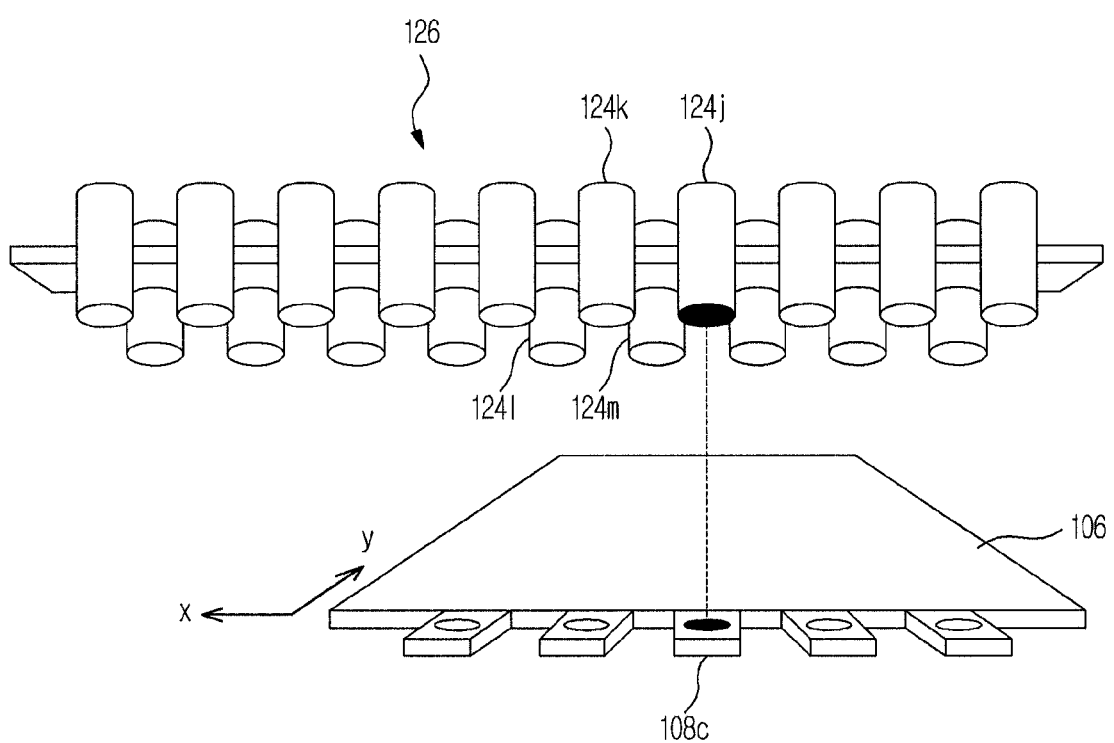
Figure 11C:
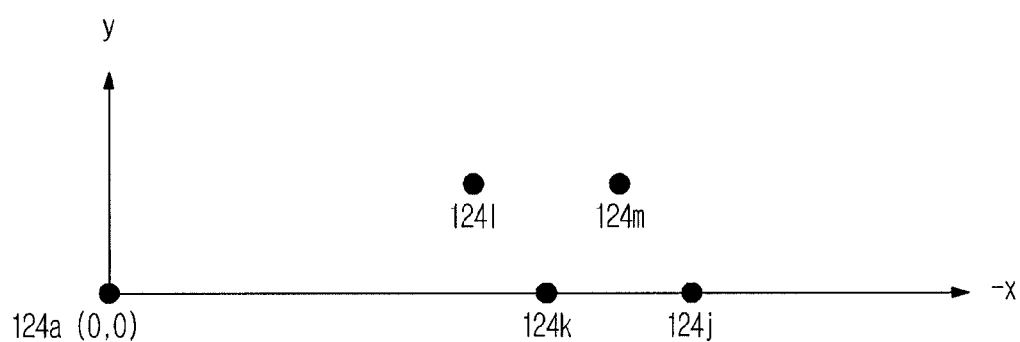

FIGS. 11A to 11C are views illustrating a method of measuring positions of other second exposure heads using another beam measurement device, similar to the method of FIGS. 10A to 10C. As shown in FIG. 11A, in order to measure the distance between the first beam measurement device (for example, the beam measurement device 108b) and the second beam measurement device (for example, a beam measurement device 108c), the stage 106, initially in a state in which the position of the beam measurement device 108b coincides with the position of the exposure head 124f, is moved so that the position of the beam measurement device 108c coincides with the position of the exposure head 124f. In order to achieve precise position measurement, in the same manner as the coincidence between the exposure head 124a and the beam measurement device 108a (for example, FIGS. 9A-9E), a predetermined/desired position of a field of view of the beam measurement device 108c coincides with a predetermined/desired beam spot of the exposure head 124f. Then the stage 106 is moved so that the position of the beam measurement device 108c coincides with the position of the exposure head 124f and a moving distance of the stage 106 is calculated as a distance between the beam measurement device 108b and the beam measurement device 108c.

FIG. 11B illustrates a state in which the stage 106 is moved so that the position of the beam measurement device 108c coincides with the position of another exposure head 124j. In order to achieve precise position measurement, in the same manner as the coincidence between the exposure head 124a and the beam measurement device 108a, the predetermined/desired position of the field of view of the beam measurement device 108c coincides with a predetermined/desired beam spot of the exposure head 124j. Then the position of the beam measurement device 108c is sequentially coincided with respective positions of exposure heads 124k~124m (for example, similar to the operation described with reference to FIGS. 9B to 9E) and respective distances from the exposure head 124j to the exposure heads 124k~124m are measured through moving distances of the stage 106.

When a third reference position is set, as described above, the control unit 120 sequentially measures respective positions (coordinates) of other exposure heads 124k, 124l and 124m from the third reference position, in the same manner as in FIGS. 9B to 9F.

FIG. 11C is a view illustrating the respective positions (coordinates) of the four exposure heads 124j~124m measured through the process of FIGS. 11A and 11B. The control unit 120 sets the position of the exposure head 124a to the origin of the coordinate system, calculates the respective coordinates of the exposure heads 124j~124m from the origin (0, 0), and then stores the calculated respective coordinates.

Figure 12A:
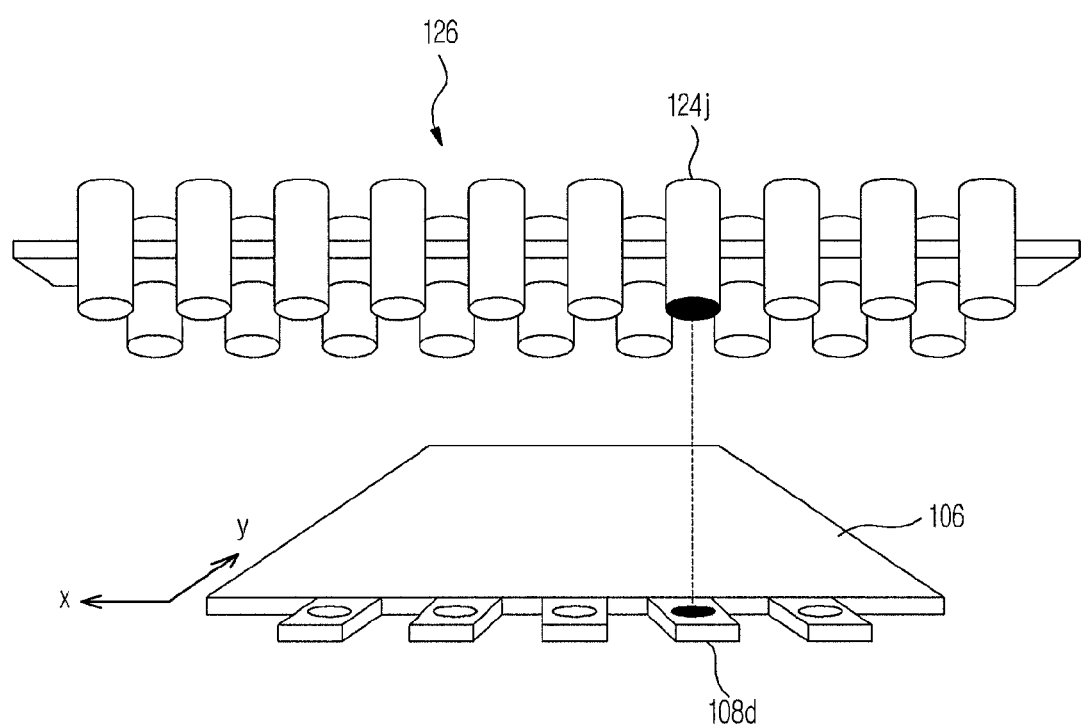
FIGS. 12A to 12C are views illustrating another method of measuring positions of other exposure heads using yet another beam measurement device.
Figure 12B:
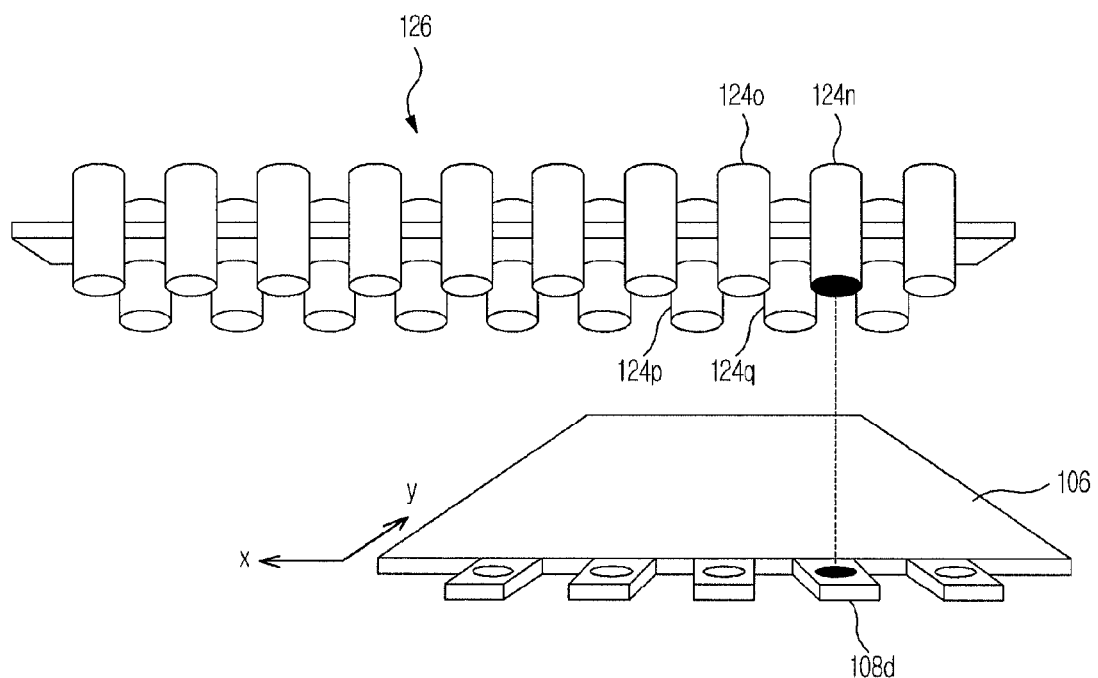
Figure 12C:
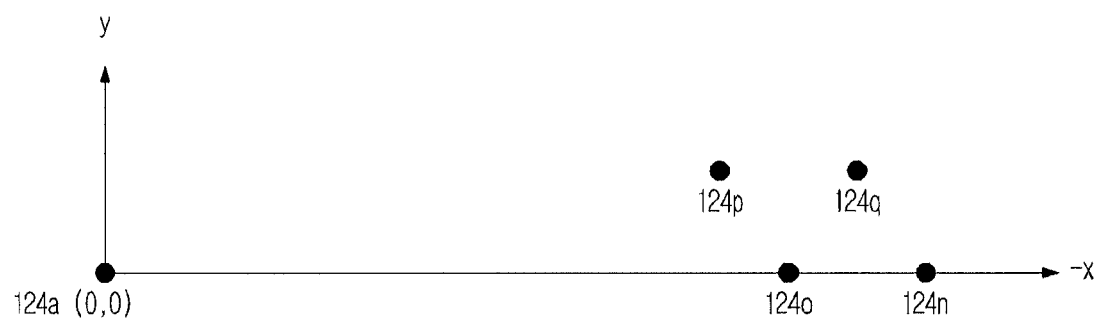

FIGS. 12A to 12C are views illustrating another method of measuring positions of other exposure heads using another beam measurement device. As shown in FIG. 12A, in order to measure the distance between a first beam measurement device (for example, the beam measurement device 108c) and a second beam measurement device (for example, a beam measurement device 108d), the stage 106, initially in a state in which the position of the beam measurement device 108c coincides with the position of the exposure head 124j, is moved so that the position of the beam measurement device 108d coincides with the position of the exposure head 124j. In order to achieve precise position measurement, in the same manner as the coincidence between the exposure head 124a and the beam measurement device 108a, a predetermined/desired position of a field of view of the beam measurement device 108d coincides with a predetermined/desired beam spot of the exposure head 124j. Then the stage 106 is moved so that the position of the beam measurement device 108d coincides with the position of the exposure head 124j and, a moving distance of the stage 106 is a distance between the beam measurement device 108c and the beam measurement device 108d.

FIG. 12B illustrates a state in which the stage 106 is moved so that the position of the beam measurement device 108d coincides with the position of another exposure head 124n. In order to achieve precise position measurement, in the same manner as the coincidence between the exposure head 124a and the beam measurement device 108a, the predetermined/desired position of the field of view of the beam measurement device 108d coincides with a predetermined/desired beam spot of the exposure head 124n. Then the position of the beam measurement device 108d is sequentially coincided with respective positions of exposure heads 124o~124q (for example, similar to the operation described with reference to FIGS. 9B to 9E) and respective distances from the exposure head 124*n* to the exposure heads 124*o*~124*q* are measured through moving distances of the stage 106.

FIG. 12C is a view illustrating the respective positions (coordinates) of the four exposure heads 124*n*~124*q* measured through the process of FIGS. 12A and 12B. The control unit 120 sets the position of the exposure head 124*a* to the origin of the coordinate system, calculates the respective coordinates of the exposure heads 124*n*~124*q* from the origin (0, 0), and then stores the calculated respective coordinates.

Figure 13A:
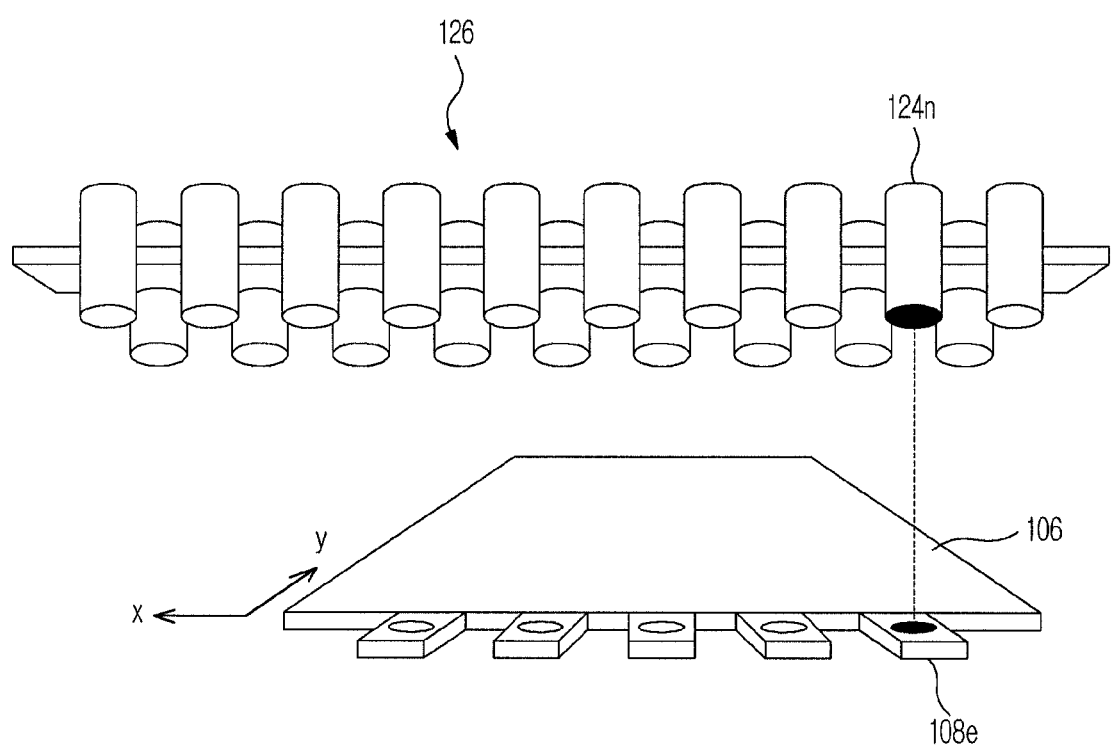
FIGS. 13A to 13C are views illustrating a method of measuring positions of other exposure heads using still another beam measurement device.
Figure 13B:
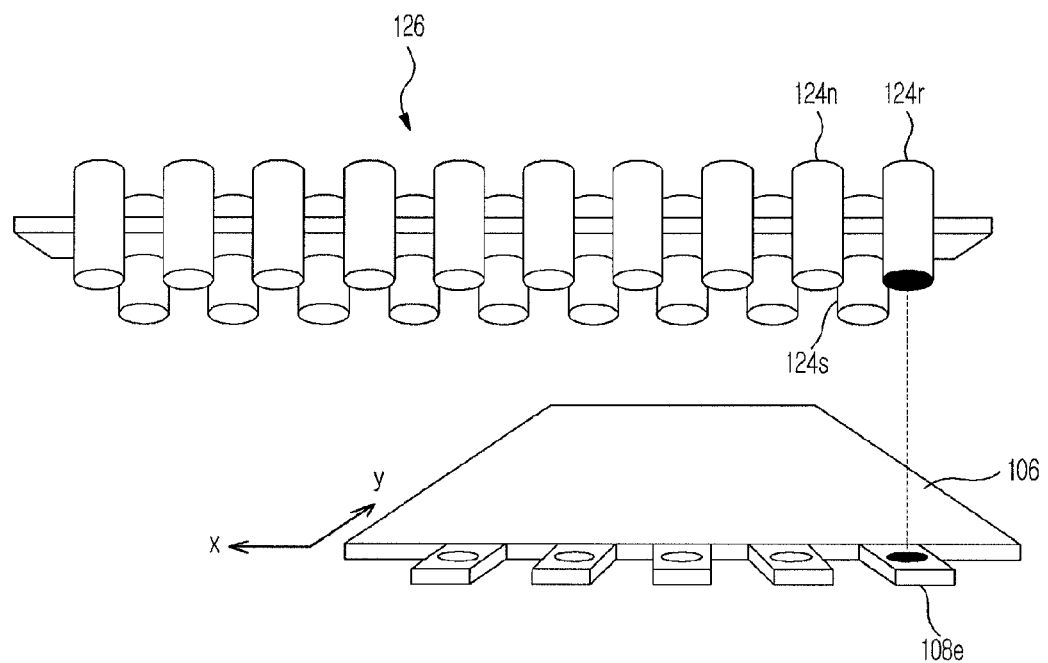
Figure 13C:

FIGS. 13A to 13C are views illustrating a method of measuring positions of other second exposure heads using still another beam measurement device. As shown in FIG. 13A, in order to measure the distance between a first beam measurement device (for example, the beam measurement device 108*d*) and the second beam measurement device (for example, a beam measurement device 108*e*), the stage 106, initially in a state in which the position of the beam measurement device 108*d* coincides with the position of the exposure head 124*n*, is moved so that the position of the beam measurement device 108*e* coincides with the position of the exposure head 124*n*. In order to achieve precise position measurement, in the same manner as the coincidence between the exposure head 124*a* and the beam measurement device 108*a*, a predetermined/desired position of a field of view of the beam measurement device 108*e* coincides with a predetermined/desired beam spot of the exposure head 124*n*. Then the stage 106 is moved so that the position of the beam measurement device 108*e* coincides with the position of the exposure head 124*n* and, a moving distance of the stage 106 is calculated as a distance between the beam measurement device 108*d* and the beam measurement device 108*e*.

FIG. 13B illustrates a state in which the stage 106 is moved so that the position of the beam measurement device 108*e* coincides with the position of another exposure head 124*r*. In order to achieve precise position measurement, in the same manner as the coincidence between the exposure head 124*a* and the beam measurement device 108*a*, the predetermined/desired position of the field of view of the beam measurement device 108*e* coincides with a predetermined/desired beam spot of the exposure head 124*r*. Then the position of the beam measurement device 108*e* is sequentially coincided with a position of another exposure head 124*s* (for example, similar to the operation described with reference to FIGS. 9B to 9E) and a distance from the exposure head 124*r* to the exposure head 124*s* is measured through moving distance of the stage 106.

FIG. 13C is a view illustrating the respective positions (coordinates) of the two exposure heads 124*r* and 124*s* measured through the process of FIGS. 13A and 13B. The control unit 120 sets the position of the exposure head 124*a* to the origin of the coordinate system, calculates the respective coordinates of the exposure heads 124*r* and 124*s* from the origin (0, 0), and then stores the calculated respective coordinates.

Figure 14:
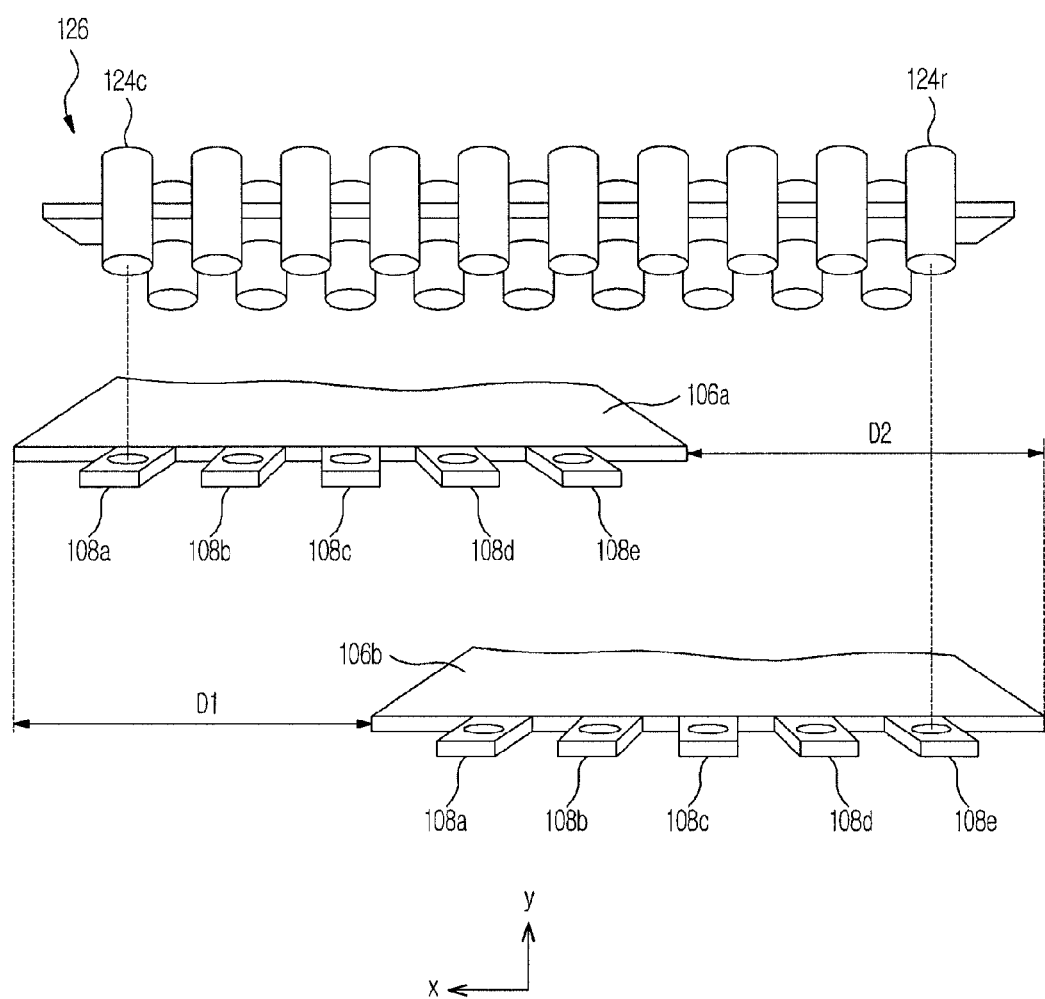
FIG. 14 is a view illustrating a moving width of the stage of the exposure apparatus according to example embodiments when respective positions of the plural exposure heads are measured.

FIG. 14 is a view illustrating a moving width of the stage of the exposure apparatus according to example embodiments when respective positions of the plural exposure heads are measured. In FIG. 14, a stage 106 located at the upper region represents a moving distance of the stage 106*a* in the positive x direction when the position of the leftmost beam measurement device 108*a* coincides with the position of the leftmost exposure head 124*c*, and a stage 106*b* located at the lower region represents a moving distance of the stage 106 in the negative x direction when the position of the rightmost beam measurement device 108*e* coincides with the position of the rightmost exposure head 124*r*. As shown in FIG. 14, the stages 106*a* and 106*b* may respectively move by a distance D1 and a distance D2 in the positive x and negative x directions so that the plural beam measurement devices 108*a*~108*e* measure respective positions of the plural exposure heads 124*a*~124*s*. If a single beam measurement device (for example, the beam measurement device 108*c*) measures the positions of all the exposure heads, considerable portions of the stage are protruded from the left and right sides of the exposure head unit 126, and thus wide working regions are required as much. Further, the moving distances of the stage in the positive x and negative x directions are also increased. Therefore, if the exposure head position measurement methods in accordance with example embodiments are used, the working regions in the positive x and negative x directions required to move the stage 106 are decreased and the moving distances of the stage 106 are also decreased, thereby shortening time required for position measurement.

Figure 15:
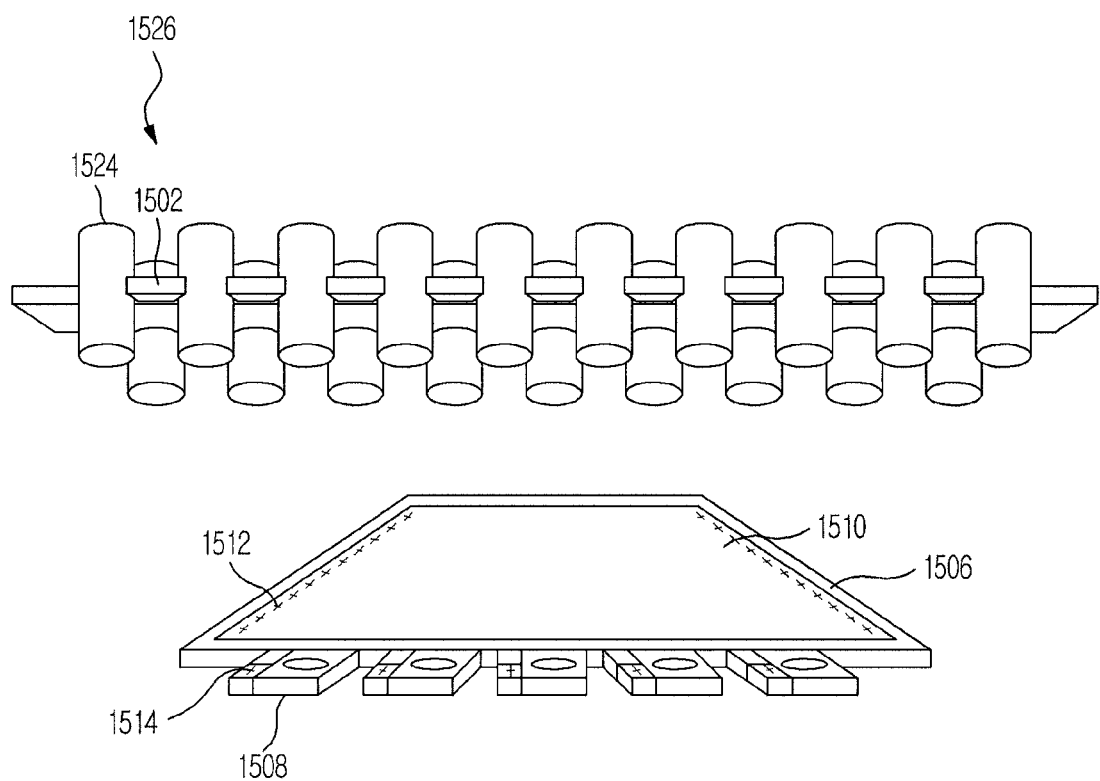
FIG. 15 is a view illustrating an exposure apparatus according to example embodiments.

FIG. 15 is a view illustrating an exposure apparatus according to example embodiments. As shown in FIG. 15, an exposure head unit 1526 includes a plurality of scopes 1502 (for example, microscopes or the like) fixed thereto as well as a plurality of exposure heads 1524. The scopes 1502 serve to recognize marks 1512 on a substrate 1510 placed on a stage 1506. For example, the scopes 1502 detect distortion of the substrate 1510, for example, size errors, position errors, rotation errors, and warpage errors of the substrate 1510, through recognition of the marks 1512.

Respective positions of the plural scopes 1502 may be also measured in the same manner as the position measurement methods described with reference to FIGS. 9A to 13C. However, when the positions of the plural scopes 1502 are measured, the plural scopes 1502 respectively observe marks 1514 provided on beam measurement devices 1508 so that positions of the scopes 1502 coincide with positions of the marks 1514. Here, a predetermined/desired position (for example, a central point) of a field of view of the scope 1502 may coincide with a predetermined/desired position (for example, a crossing point) of the mark 1514. Measurement of the respective positions of the plural scopes 1502 may be obtained based on the positions of the plural exposure heads 1524 measured prior to measuring the position of the plural scopes 1502, or only the respective positions of the plural scopes 1502 may be measured. Measuring only the positions of the plural scopes 1502 may be performed according to the method of FIGS. 9A to 9E may be used.

If positions (or alternatively position coordinates) of the plural exposure heads 124 and the plural beam measurement devices 108 are calculated, exposure may be based on the calculated positions (coordinates) of the plural exposure heads 124 and the plural beam measurement devices 108, when exposure is performed on the substrate. Here, if there are errors between the actual positions of (coordinates) of the plural exposure heads 124 and the plural beam measurement devices 108 and expected/desired positions (target positions) of the plural exposure heads 124 and the plural beam measurement devices 108, the respective positions of the plural exposure heads 124 may be adjusted so as to be close to the expected/desired positions. For example, the plural exposure heads 124 are configured such that the exposure heads 124 may finely move (for example, in small increments) in the positive and negative x directions and in the positive and negative y directions. Although the actual positions of (coordinates) of the plural exposure heads 124 and the plural beam measurement devices 108 are equal to the expected positions, if formation angles of the beam spot array 602 at all the exposure heads 124 are not uniform and thus cause rotation errors, exposure quality may be lowered. Therefore, the plural exposure heads 124 are configured such that the exposure heads 124 may be rotated, thereby correcting the rotation errors of the beam spot array 602 at all the exposure heads 124 and thus enabling rotation angles to be uniform.

As is apparent from the above description, according to example embodiments, a size of a maskless exposure apparatus and working regions of the exposure apparatus are minimized while measuring positions of plural exposure heads provide on the exposure apparatus.

In accordance with example embodiments, distortion of a substrate placed on the stage is detected through position measurement of a plurality of scopes to measure marks on the substrate, thereby minimizing overlay or stitch errors of a maskless exposure apparatus.

Example embodiments may be implemented, in software, for example, as any suitable computer program. For example, a program in accordance with one or more example embodiments may be a computer program product causing a computer to execute one or more of the example methods described herein.

The computer program product may include a computer-readable medium having computer program logic or code portions embodied thereon for enabling a processor of to perform one or more functions in accordance with one or more example methodology described above. The computer program logic may thus cause the processor to perform one or more of the example methodologies, or one or more functions of a given methodology described herein.

The computer-readable storage medium may be a built-in medium inside a computer main body or removable medium arranged so that it may be separated from a computer main body. Examples of the built-in medium include, but are not limited to, rewriteable non-volatile memories, such as RAMs, ROMs, flash memories, and hard disks. Examples of a removable medium may include, but are not limited to, optical storage media such as CD-ROMs and DVDs; magneto-optical storage media such as MOs; magnetism storage media such as floppy disks (trademark), cassette tapes, and removable hard disks; media with a built-in rewriteable non-volatile memory such as memory cards; and media with a built-in ROM, such as ROM cassettes.

These programs may also be provided in the form of an externally supplied propagated signal and/or a computer data signal (e.g., wireless or terrestrial) embodied in a carrier wave. The computer data signal embodying one or more instructions or functions of an example methodology may be carried on a carrier wave for transmission and/or reception by an entity that executes the instructions or functions of the example methodology. For example, the functions or instructions of the example embodiments may be implemented by processing one or more code segments of the carrier wave, for example, in a computer, where instructions or functions may be executed for simulating arbitrary software and/or unmodified code directly on a host processor, in accordance with example embodiments.

Further, such programs, when recorded on computer-readable storage media, may be readily stored and distributed. The storage medium, as it is read by a computer, may enable the simulation of arbitrary software and/or unmodified code directly on a host processor, in accordance with the example embodiments.

Example embodiments being thus described, it will be obvious that the same may be varied in many ways. For example, the methods according to example embodiments may be implemented in hardware and/or software. The hardware/software implementations may include a combination of processor(s) and article(s) of manufacture. The article(s) of manufacture may further include storage media and executable computer program(s), for example, a computer program product stored on a computer readable medium.

The executable computer program(s) may include the instructions to perform the described operations or functions. The computer executable program(s) may also be provided as part of externally supplied propagated signal(s).

Example embodiments having thus been described, it will be obvious that the same may be varied in many ways. Such variations are not to be regarded as a departure from the intended spirit and scope of example embodiments, and all such modifications as would be obvious to one skilled in the art are intended to be included within the scope of the following claims.

What is claimed is:

1. A method of operating an exposure apparatus, the exposure apparatus including a stage having a plurality of beam measurement devices, and the exposure apparatus including an exposure head unit having a first set of exposure heads and a second set of exposure heads, the method comprising:
    measuring a position of a first exposure head of the first set of exposure heads by moving the stage to coincide a first beam measurement device of the plurality of beam measurement devices with the first exposure head;
    setting the measured position of the first exposure head as a reference position; and
    measuring positions of the second set of exposure heads with respect to the reference position.

2. The method according to claim 1, wherein measuring the positions of the second set of exposure head includes:
    moving the stage to coincide a second beam measurement device of the plurality of beam measurement devices with the first exposure head;
    measuring a position of the second beam measurement device with respect to the reference position;
    moving the stage to coincide the second beam measurement device with a first exposure head of the second set of exposure heads; and
    measuring a position of the first exposure head of the second set of exposure heads with respect to the reference position.

3. The method of claim 2, further comprising:
    moving the stage to coincide the second beam measurement device with a second exposure head of the second set of exposure heads;
    measuring a position of the second exposure head of the second set of exposure heads with respect to the reference position;
    sequentially repeating the moving and measuring with respect to the remaining exposure heads of the second set of exposure heads; and
    mapping the distances the stage moves with respect to the reference position.

4. The method according to claim 1, wherein the stage moves in at least two mutually orthogonal directions.

5. The method according to claim 4, wherein at least one of the mutually orthogonal directions is a scanning direction of the exposure apparatus.

6. The method according to claim 1, further comprising:
    obtaining and storing positions of the exposure heads of the first and second set of exposure heads with respect to the reference position.

7. The method according to claim 1, further comprising:
    correcting an error between desired positions of the first and second set of exposure heads and positions of the first and second set of exposure heads obtained during exposure based on the measured positions of the first and second set of exposure heads.

8. The method according to claim 7, wherein correcting an error includes correcting an error associated with a rotation of the first and second set of exposure heads.

9. The method according to claim 1, wherein the coinciding includes coinciding a field of view of the first beam measurement device with a desired beam spot of the first exposure head.

10. The method of claim 1, further comprising:
moving the stage to coincide a second exposure head of the first set of exposure heads with the first beam measurement device;
calculating a distance moved by the stage as a distance between the first and second exposure heads;
sequentially repeating the moving and calculating with respect to the remaining exposure heads of the first set of exposure heads; and
mapping the distances the stage moves with reference to the first exposure head.

11. The method of claim 1, further comprising:
providing a plurality of scopes in the first and second set of exposure heads, each of the plurality of scopes being between the exposure heads of the first set of exposure head and between exposure heads of the second set of exposure heads; and
measuring positions of the plurality of scopes.

12. The method of claim 11, wherein the measuring the positions of the plurality of scopes comprises:
measuring a position of a first scope of the plurality of scopes by moving the stage to coincide a first mark provided on at least one of the plurality of beam measurement devices with the first scope;
moving the stage to coincide a second scope of the plurality of scopes with the first mark;
calculating a distance moved by the stage as a distance between the first and second scopes; and
mapping the distance as a position coordinate of the second scope with reference to the first scope.

13. The method according to claim 11, further comprising:
detecting distortion of a substrate on the stage using the plurality of scopes.

14. The control method according to claim 13, wherein the distortion of the substrate includes one of size errors, position errors, rotation errors, and warpage errors of the substrate.

15. A method of operating a maskless exposure apparatus according to the method of claim 1.

16. A computer program product comprising a non-transitory computer useable recording medium having computer readable program codes embodied in the medium that, when executed on a computer, cause the computer to carry out the method as claimed in claim 1.

17. An exposure apparatus, comprising:
a stage including a plurality of beam measurement devices, the stage configured to move a substrate to expose a desired pattern on the substrate;
an exposure head unit including a plurality of exposure heads, the plurality of exposure heads configured to expose the desired pattern on the substrate; and
a control unit configured to sequentially coincide at least one of the plurality of beam measurement devices with the plurality of exposure heads and measuring a position of each exposure head during each coincidence;
wherein a position of one of the exposure heads is set as a reference position and the positions of the remaining exposure heads are mapped with respect to the reference position.

18. The exposure apparatus according to claim 17, wherein the control unit is further configured to:
coincide a position of a second beam measurement device of the plurality of beam measurement devices with a first exposure head;
measure a position of the second beam measurement device with respect to the reference position;
coincide the position of the second beam measurement device with a position of a second exposure head of the plurality of exposure heads; and
measure a position of the second exposure head with respect to the reference position.

19. The exposure apparatus according to claim 17, wherein the stage moves in at least two mutually perpendicular directions.

20. The exposure apparatus according to claim 19, wherein at least one of the at least two directions is a scanning direction of the exposure apparatus.

21. The exposure apparatus according to claim 17, wherein the control unit is further configured to store position coordinates of each of the measured exposure heads with respect to the reference position.

22. The exposure apparatus according to claim 17, wherein the control unit is further configured to correct an error between desired positions of the exposure heads and positions of the exposure heads obtained during exposure based on the measured positions of the exposure heads.

23. The exposure apparatus according to claim 22, wherein the error includes an error associated with a rotation of the plurality of exposure heads.

24. The exposure apparatus according to claim 17, wherein the control unit is configured to coincide a field of view of the at least one first beam measurement device with a desired beam spot of an exposure head.

25. The exposure apparatus according to claim 17, further comprising:
a plurality of scopes, at least one of the plurality of scopes being between the plurality of exposure heads,
wherein the control unit measures positions of the plurality of scopes based on the reference position.

26. The exposure apparatus according to claim 25, further comprising:
a plurality of marks on the plurality of beam measurement devices, wherein the control unit is configured to,
measure a position of a first scope of the plurality of scopes by moving the stage to coincide a first mark of the plurality of marks with the first scope;
move the stage to coincide a second scope of the plurality of scopes with the first mark;
calculate a distance moved by the stage as a distance between the first and second scopes; and
map the distance as a position coordinate of the second scope with reference to the first scope.

27. The exposure apparatus according to claim 25, wherein the control unit is further configured to detect distortion of a substrate on the stage via the plurality of scopes.

28. The exposure apparatus according to claim 27, wherein the distortion of the substrate includes one of size errors, position errors, rotation errors, and warpage errors of the substrate.

29. The exposure apparatus according to claim 17, being a maskless exposure apparatus.

* * * * *